United States Patent
Wada et al.

(10) Patent No.: US 8,487,449 B2
(45) Date of Patent: Jul. 16, 2013

(54) CARBON NANOTUBE INTERCONNECTION AND MANUFACTURING METHOD THEREOF

(75) Inventors: Makoto Wada, Yokohama (JP); Yuichi Yamazaki, Inagia (JP); Masayuki Katagiri, Kawasaki (JP); Masayuki Kitamura, Yokohama (JP); Atsuko Sakata, Yokohama (JP); Akihiro Kajita, Yokohama (JP); Tadashi Sakai, Yokohama (JP); Naohsi Sakuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 13/215,463

(22) Filed: Aug. 23, 2011

(65) Prior Publication Data
US 2012/0049370 A1    Mar. 1, 2012

(30) Foreign Application Priority Data
Aug. 25, 2010   (JP) .................................. 2010-188662

(51) Int. Cl.
*H01L 29/70* (2006.01)
*H01L 21/4763* (2006.01)

(52) U.S. Cl.
USPC ........................... 257/774; 257/758; 438/629

(58) Field of Classification Search
USPC ................................... 257/758, 774; 438/629
See application file for complete search history.

(56) References Cited

U.S. PATENT DOCUMENTS

| | | | |
|---|---|---|---|
| 2006/0292861 A1* | 12/2006 | Furukawa et al. | 438/627 |
| 2008/0150152 A1* | 6/2008 | Dijon et al. | 257/774 |
| 2008/0237858 A1* | 10/2008 | Nihei | 257/746 |
| 2008/0246149 A1* | 10/2008 | Kwak et al. | 257/751 |
| 2009/0146304 A1* | 6/2009 | Son et al. | 257/750 |
| 2010/0244262 A1 | 9/2010 | Awano et al. | |
| 2011/0233779 A1 | 9/2011 | Wada et al. | |

FOREIGN PATENT DOCUMENTS

| | | |
|---|---|---|
| JP | 2007-091484 | 4/2007 |
| JP | 2008-258184 | 10/2008 |

(Continued)

OTHER PUBLICATIONS

Sato, Shintaro, et al., "Novel approach to fabricating carbon nanotube via interconnects using size-controlled catalyst nanoparticles", IEEE Interconnect Technology Conference, 2006, pp. 230.

Katagiri, Masayuki, et al., "Carbon Nanotube Vias Fabricated by Remote Plasma-Enhanced Chemical Vapor Deposition", Applied Physics VI, vol. 47, No. 4, 2008, pp. 2024-2027.

(Continued)

*Primary Examiner* — James Mitchell
(74) *Attorney, Agent, or Firm* — White & Case LLP

(57) ABSTRACT

According to one embodiment, a carbon nanotube interconnection includes a first conductive layer, an insulating film, a catalyst underlying film, a catalyst deactivation film, a catalyst film, and carbon nanotubes. An insulating film is formed on the first conductive layer and including a hole. An catalyst underlying film is formed on the first conductive layer on a bottom surface in the hole and on the insulating film on a side surface in the hole. A catalyst deactivation film is formed on the catalyst underlying film on the side surface in the hole. A catalyst film is formed on the catalyst underlying film on the bottom surface in the hole and the catalyst deactivation film on the side surface in the hole. Carbon nanotubes are formed in the hole, the carbon nanotubes including one end in contact with the catalyst film on the bottom surface in the hole.

18 Claims, 22 Drawing Sheets

FOREIGN PATENT DOCUMENTS

| | | |
|---|---|---|
| JP | 2009-027157 | 2/2009 |
| JP | 2010-006696 | 1/2010 |
| KR | 10-2004-0041074 | 5/2004 |
| KR | 10-0721020 | 5/2007 |
| KR | 10-2007-0105182 | 10/2007 |
| KR | 10-2008-0089243 | 10/2008 |

OTHER PUBLICATIONS

Japanese Office Action for Japanese Application No. 2010-188662 mailed on Nov. 27, 2012.

Korean Office Action for Korean Application No. 10-2011-82810 mailed on Oct. 17, 2012.

* cited by examiner

CARBON NANOTUBE INTERCONNECTION AND MANUFACTURING METHOD THEREOF

CROSS-REFERENCE TO RELATED APPLICATIONS

This application is based upon and claims the benefit of priority from prior Japanese Patent Application No. 2010-188662, filed Aug. 25, 2010, the entire contents of which are incorporated herein by reference.

FIELD

Embodiments described herein relate generally to a carbon nanotube interconnection and manufacturing method thereof.

BACKGROUND

LSI interconnection structures used in most advanced devices are leading to a decrease in interconnection dimensions and via diameter.

Applications of carbon nanotubes (CNTs) as the via material of LSI interconnections have been developed worldwide. Carbon nanotubes exhibit a variety of quantum effects depending on various nanostructure differences, and can be formed separately into an insulator, semiconductor, or conductor. In particular, carbon nanotubes formed as a conductor are expected to implement quantum (ballistic) transport. For this reason, carbon nanotubes can be used as an ultralow-resistance material which replaces existing metal materials (for example, Cu interconnections).

DETAILED DESCRIPTION

Figure 1:
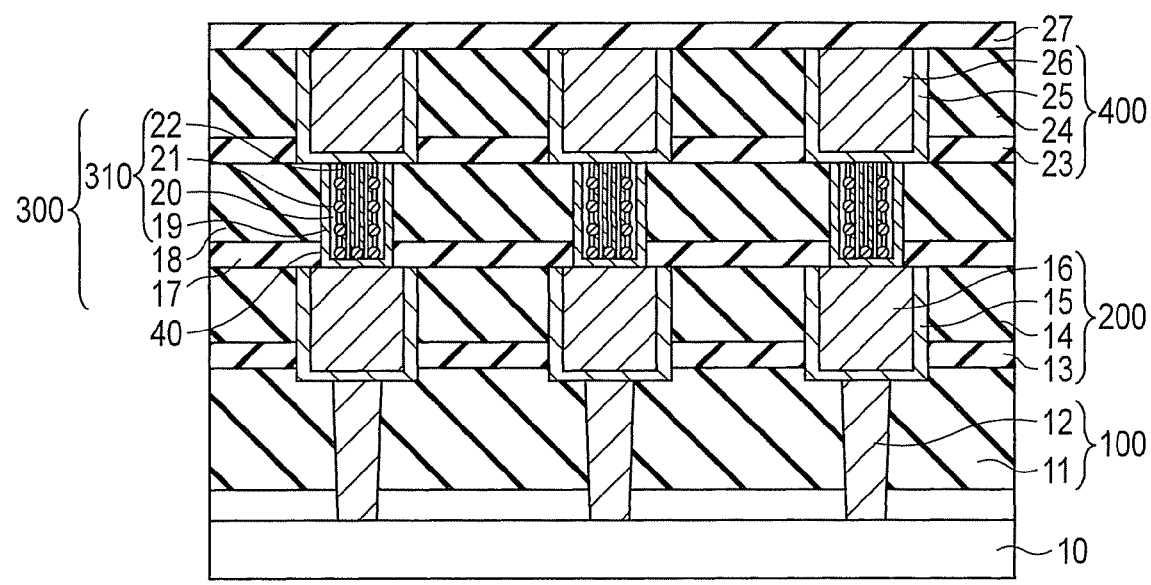
FIG. 1 is a sectional view showing the structure of a carbon nanotube interconnection according to the first embodiment.

In general, according to one embodiment, a carbon nanotube interconnection includes: a first conductive layer; an insulating film; a catalyst underlying film; a catalyst deactivation film; a catalyst film; and carbon nanotubes. An insulating film is formed on the first conductive layer and including a hole. An catalyst underlying film is formed on the first conductive layer on a bottom surface in the hole and on the insulating film on a side surface in the hole. A catalyst deactivation film is formed on the catalyst underlying film on the side surface in the hole. A catalyst film is formed on the catalyst underlying film on the bottom surface in the hole and the catalyst deactivation film on the side surface in the hole. Carbon nanotubes are formed in the hole, the carbon nanotubes including one end in contact with the catalyst film on the bottom surface in the hole.

Preferred embodiments will now be described with reference to the accompanying drawing. The same reference numbers denote the same parts throughout the drawing.

<First Embodiment>

The structure and manufacturing method of a carbon nanotube interconnection according to the first embodiment will be described with reference to FIGS. 1, 2A, 2B, 3A, 3B, 4A, 4B, 5A, 5B, and 6. The first embodiment will explain an example in which the growth rate of carbon nanotubes from the side surface in the via hole is decreased by forming a catalyst deactivation film on the side surface in the via hole.

[Structure]

FIG. 1 is a sectional view showing a carbon nanotube interconnection according to the first embodiment.

As shown in FIG. 1, as an example of the interconnection structure, a contact layer 100, first interconnection layer 200, via layer 300, and second interconnection layer 400 are formed on a substrate 10 having semiconductor devices such as transistors and capacitors (none shown).

The contact layer 100 is formed on the substrate 10. The contact layer 100 comprises a contact layer insulating film 11 and contacts 12.

The contact layer insulating film 11 is formed on the substrate 10 and contains, for example, tetraethoxysilane (TEOS). Each contact 12 is formed in the contact layer insulating film 11, and electrically connects a semiconductor device formed on the substrate 10 to the first interconnection layer 200 (described later). The conductive material of the contact 12 is a single metal such as W, Cu, or Al. To prevent diffusion of the conductive material metal of the contact 12, a barrier metal portion (not shown) may be interposed between the contact 12 and the contact layer insulating film 11. Examples of the barrier metal are Ta, Ti, Ru, Mn, Co, and their nitrides.

The first interconnection layer 200 is formed on the contact layer 100. The first interconnection layer 200 comprises a stopper film 13, an interconnection layer insulating film 14, barrier metal portions 15, and lower interconnections 16.

The stopper film 13 is formed on the contact layer 100, and contains a material (for example, SiCN) with high process selectivity with respect to the interconnection layer insulating film 14. When the process selectivity of the interconnection layer insulating film 14 and contact layer insulating film 11 is sufficiently high, the stopper film 13 need not be formed. The interconnection layer insulating film 14 is formed on the stopper film 13 and contains, for example, SiOC. The interconnection layer insulating film 14 may be a film containing pores (small hollows) to decrease the permittivity. The lower interconnection 16 is formed on each barrier metal portion 15 in the interconnection layer insulating film 14. The conductive material of the lower interconnection 16 is a single metal such as W, Cu, or Al, or polysilicon. Examples of the barrier metal portion 15 are Ta, Ti, Ru, Mn, Co, and their nitrides and oxides.

The via layer 300 is formed on the first interconnection layer 200. The via layer 300 comprises a stopper film 17, a via layer insulating film 18, and via 310.

The stopper film 17 is formed on the first interconnection layer 200, and contains a material (for example, SiCN) with high process selectivity with respect to the via layer insulating film 18. When the process selectivity of the via layer insulating film 18 and interconnection layer insulating film 14 is sufficiently high, the stopper film 17 need not be formed. The via layer insulating film 18 is formed on the stopper film 17 and contains, for example, SiOC. The via layer insulating film 18 may be a film containing pores (small hollows) to decrease the permittivity. A capping film (not shown) may be formed as a protective film on the via layer insulating film 18. The capping film contains, for example, $SiO_2$ or SiOC. When the via layer insulating film 18 contains TEOS or SiOC not containing pores (small hollows), no capping film need be formed.

The via 310 is formed in each via hole 40 extending through the via layer insulating film 18, and electrically connects the first interconnection layer 200 to the second interconnection layer 400 (described later). More specifically, the via 310 comprises a catalyst underlying film 19, a catalyst deactivation film 20, a catalyst film 21, and a plurality of carbon nanotubes 22 which are formed in the via hole 40.

The catalyst underlying film 19 is formed on the first interconnection layer 200 on the bottom surface in the via hole 40, and on the via layer insulating film 18 on the side surface in the via hole 40. The catalyst underlying film 19 is, for example, a multilayer TaN/TiN film or a multilayer TaN/Ti film. The TaN film is formed on the surface in the via hole 40 and is, for example, approximately 5 nm thick. The TaN film functions as a diffusion barrier to prevent interdiffusion of Cu of the lower interconnection 16 and Co of the catalyst film 21 for the growth of the carbon nanotubes 22. The TaN film has a promoter effect on the growth of the carbon nanotubes 22. The TiN or Ti film is formed on the TaN film and is, for example, approximately 5 nm thick. The TiN or Ti film terminates the end face of the carbon nanotube 22 as Ti carbide, forming a good interface contact of the carbon nanotube 22. Also, the TiN or Ti film has a promoter effect on the growth of the carbon nanotubes 22.

When the lower interconnection 16 contains a material other than Cu, no TaN film need be formed in the catalyst underlying film 19. In this case, the catalyst underlying film 19 is a single-layer TiN film or a multilayer Ti/TiN film. More specifically, when the lower interconnection 16 contains, for example, W, the catalyst underlying film 19 is desirably a single-layer TiN film. When the lower interconnection 16 contains, for example, polysilicon, the catalyst underlying film 19 is desirably a multilayer Ti/TiN film.

In this manner, the catalyst underlying film 19 enhances the catalytic effect of the catalyst film 21, and functions as a diffusion barrier. In addition, forming a good interface contact of the carbon nanotube 22 improves the electrical characteristics of the interconnection.

The catalyst deactivation film 20 is formed on the catalyst underlying film 19 on the side surface in the via hole 40. The catalyst deactivation film 20 contains a material which deactivates the catalysis of the catalyst film 21 (described later), and inhibits the growth of the carbon nanotubes 22 or decreases the growth rate. More specifically, the catalyst deactivation film 20 contains, for example, Si (for example, polysilicon or amorphous silicon), SiN, SiC, SiCN, Ru, or NiSi. The catalyst deactivation film 20 is formed not on the bottom surface but only on the side surface in the via hole 40. Thus, the catalyst deactivation film 20 inhibits the growth of the carbon nanotubes 22 from the side surface or decreases the growth rate.

For example, when the catalyst deactivation film 20 contains SiN, it inhibits the growth of the carbon nanotubes 22 or decreases the growth rate because the catalyst underlying film 19 and catalyst film 21 do not contact each other. For example, when the catalyst deactivation film 20 contains Si or Ru, it prevents contact between the catalyst underlying film 19 and the catalyst film 21, and reacts with the catalyst film 21 to decrease the catalysis of the catalyst film 21. The catalyst deactivation film 20 further inhibits the growth of the carbon nanotubes 22 or decreases the growth rate.

The catalyst film 21 is formed on the catalyst underlying film 19 and catalyst deactivation film 20 in the via hole 40. More specifically, the catalyst film 21 is formed on the catalyst underlying film 19 on the bottom surface in the via hole 40, and formed on the catalyst deactivation film 20 on the side surface. The catalyst film 21 serves as the actual catalyst of the carbon nanotube 22, and contains, for example, Co, Ni, or Fe. The catalyst film 21 is desirably formed discontinuously in a dispersion state. This allows growth of the carbon nanotubes 22 at high density in the via hole 40.

A plurality of carbon nanotubes 22 are formed to extend (grow) vertically from the catalyst film 21 on the bottom surface in the via hole 40, and fill the via hole 40. That is, the carbon nanotube 22 has one end in contact with the catalyst film 21 on the bottom surface in the via hole 40, and the other end in contact with the second interconnection layer 400 (described later). With this structure, the carbon nanotubes 22 electrically connect the first interconnection layer 200 to the second interconnection layer 400. This is because forming the catalyst deactivation film 20 on only the side surface in the via hole 40 suppresses the growth of the carbon nanotubes 22 from the side surface in the via hole 40.

The second interconnection layer 400 is formed on the via layer 300. The second interconnection layer 400 comprises a stopper film 23, an interconnection layer insulating film 24, barrier metal portions 25, and upper interconnections 26. The second interconnection layer 400 has the same structure as that of the first interconnection layer 200.

The stopper film 23 is formed on the via layer 300, and contains a material (for example, SiCN) with high process selectivity with respect to the interconnection layer insulating film 24. When the process selectivity of the interconnection layer insulating film 24 and via layer insulating film 18 is sufficiently high, the stopper film 23 need not be formed. The interconnection layer insulating film 24 is formed on the stopper film 23 and contains, for example, SiOC. The interconnection layer insulating film 24 may be a film containing pores (small hollows) to decrease the permittivity. The upper interconnection 26 is formed on each barrier metal portion 25 in the interconnection layer insulating film 24. The conductive material of the upper interconnection 26 is a single metal such as W, Cu, or Al, or polysilicon. Examples of the barrier metal portion 25 are Ta, Ti, Ru, Mn, Co, and their nitrides and oxides.

Note that the interconnection structure has two interconnection layers (first interconnection layer 200 and second interconnection layer 400) in FIG. 1, but may have three or more interconnection layers. The carbon nanotubes 22 are used as the via 310 between the first interconnection layer 200 and the second interconnection layer 400. However, the carbon nanotubes 22 may be used as the contact layer 100 between the substrate 10 and the first interconnection layer 200.

[Manufacturing Method]

FIGS. 2A, 2B, 3A, 3B, 4A, 4B, 5A, 5B, and 6 are sectional views respectively showing steps in manufacturing the carbon nanotube interconnection according to the first embodiment.

Figure 2A:
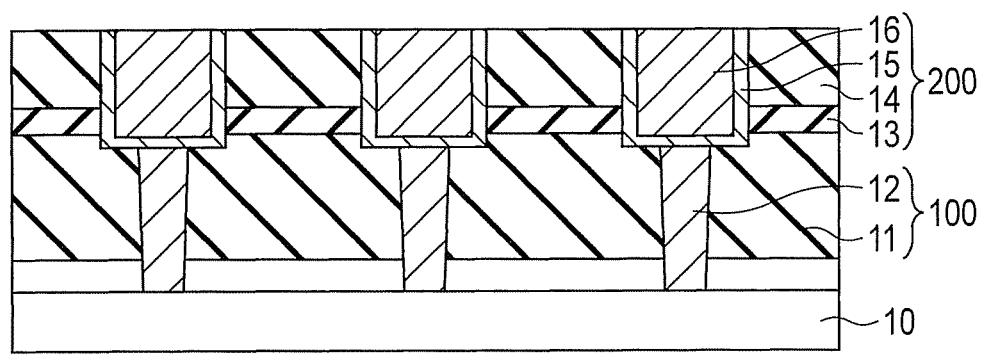
FIGS. 2A-6 are sectional views respectively showing steps in manufacturing the carbon nanotube interconnection according to the first embodiment.

As shown in FIG. 2A, a contact layer 100 is formed on a substrate 10 having semiconductor devices. More specifically, a contact layer insulating film 11 is formed on the substrate 10 by, for example, chemical vapor deposition (CVD), and contact holes are formed in the contact layer insulating film 11 by, for example, lithography. Contacts 12 are buried in the contact holes by, for example, CVD. At this time, a barrier metal portion (not shown) may be formed at the surface of the contact hole to prevent diffusion of the conductive material metal of the contact 12.

Then, a first interconnection layer 200 is formed on the contact layer 100. More specifically, a stopper film 13 is formed on the contact layer 100 by, for example, CVD. The stopper film 13 makes uniform the process depth of the first interconnection layer 200 by reactive ion etching (RIE). When the process selectivity of the interconnection layer insulating film 14 and contact layer insulating film 11 is sufficiently high, the process depth of the first interconnection layer 200 can be satisfactorily controlled without forming the stopper film 13. An interconnection layer insulating film 14 is formed on the stopper film 13 by, for example, CVD. A capping film (not shown) is formed as a protective film against damage in RIE and CMP processes on the interconnection layer insulating film 14. The capping film contains, for example, $SiO_2$ or SiOC. No capping film need be formed when the interconnection layer insulating film 14 is a film resistant to damage by RIE, for example, TEOS or SiOC not having pores (small hollows).

A resist (not shown) is applied to the interconnection layer insulating film 14, and a lithography process is carried out. After that, single damascene interconnection structures are formed in the interconnection layer insulating film 14 by the RIE process. A barrier metal portion 15 is formed on the surface of each damascene interconnection structure by, for example, CVD, physical vapor deposition (PVD), or atomic layer deposition (ALD). After a Cu seed film is formed as the cathode of electrolytic plating on the barrier metal portion 15, a Cu film is formed as a lower interconnection 16 by, for example, electrolytic plating. The Cu film is annealed to stabilize the crystal structure. Further, CMP is performed to polish an excess Cu film, completing the lower interconnection 16.

Figure 2B:
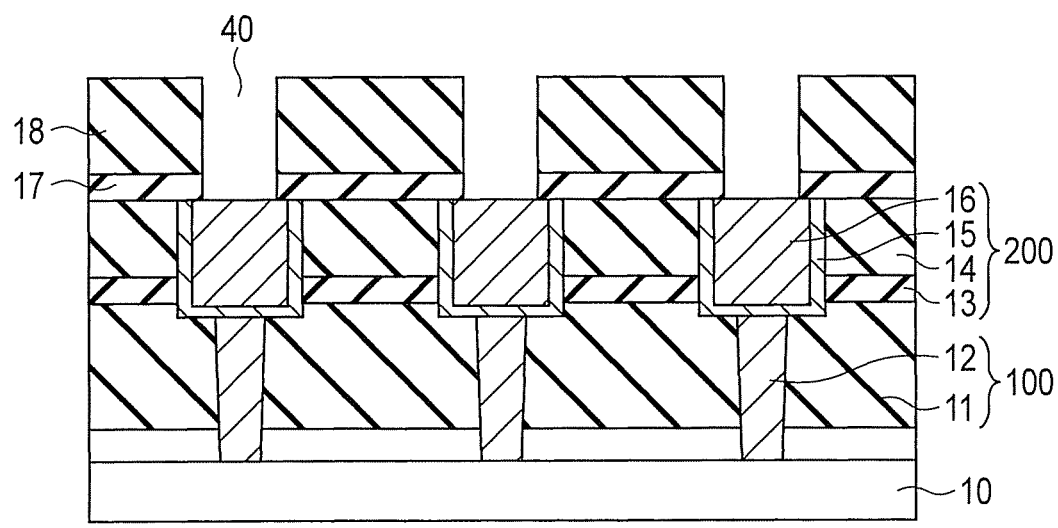

Next, as shown in FIG. 2B, a via layer 300 is formed on the first interconnection layer 200. More specifically, a stopper film 17 is formed on the first interconnection layer 200 to prevent surface diffusion of the Cu film. A via layer insulating film 18 is formed on the stopper film 17 by, for example, CVD or coating. A capping film (not shown) is formed as a protective film against damage in RIE and CMP processes on the via layer insulating film 18. The capping film contains, for example, $SiO_2$ or SiOC. No capping film need be formed when the via layer insulating film 18 is a film resistant to damage by RIE, for example, TEOS or SiOC not having pores (small hollows). A resist (not shown) is applied to the via layer insulating film 18, and a lithography process is performed. Then, via holes 40 are formed in the via layer insulating film 18 by the RIE process to extend through the via layer insulating film 18.

Figure 3A:
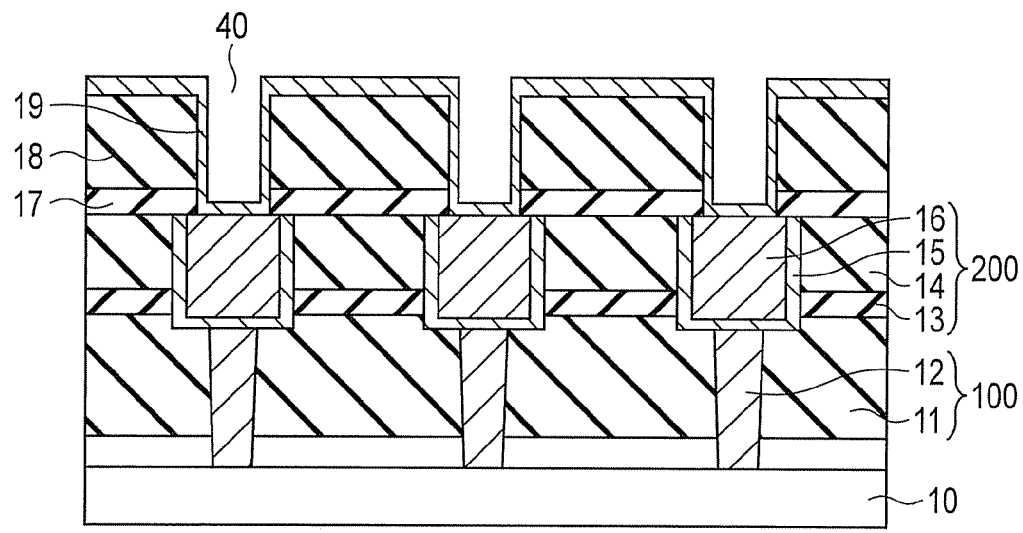

As shown in FIG. 3A, a catalyst underlying film 19 is formed on the entire surface by, for example, CVD or PVD. That is, the catalyst underlying film 19 is formed on the first interconnection layer 200 on the bottom surface in each via hole 40, and on the via layer insulating film 18 on the side surface in the via hole 40 and the upper surface outside the via hole 40 (flat portion except the via hole 40). The catalyst underlying film 19 is, for example, a multilayer TaN/TiN film, a multilayer TaN/Ti film, a single-layer TIN film, or a multilayer Ti/TiN film. The catalyst underlying film 19 has a promoter effect on the growth of the carbon nanotubes 22.

Figure 3B:
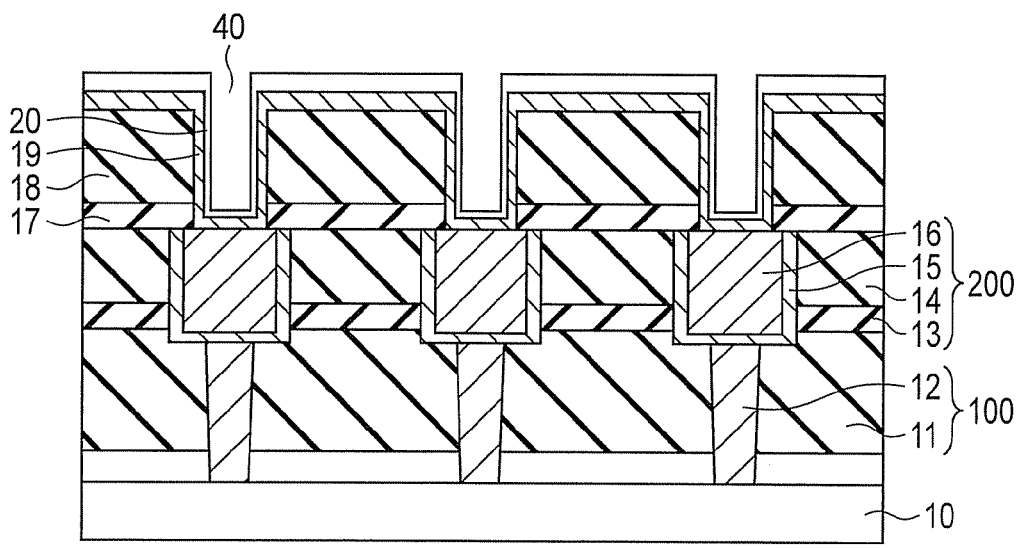

As shown in FIG. 3B, a catalyst deactivation film 20 is formed on the entire surface by, for example, CVD, PVD, or ALD. That is, the catalyst deactivation film 20 is formed on the bottom and side surfaces in each via hole 40, and on the catalyst underlying film 19 on the upper surface outside the via hole 40. The catalyst deactivation film 20 contains, for example, Si (polysilicon or amorphous silicon), SiN, SIC, SiCN, Ru, or NiSi. It suffices to form the catalyst deactivation film 20 on at least the side surface in the via hole 40, and need be formed neither on the bottom surface in the via hole 40 nor on the upper surface outside the via hole 40.

Figure 4A:
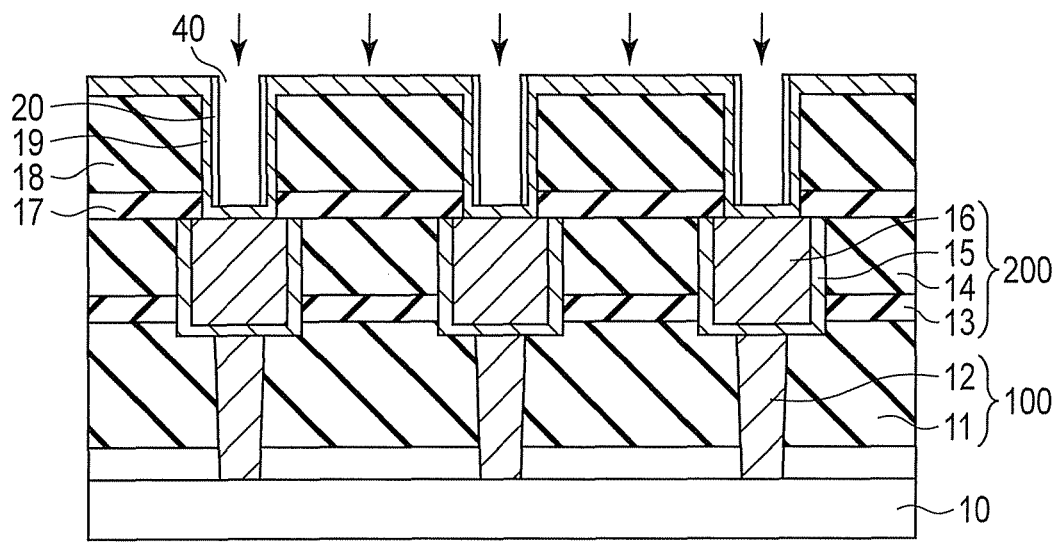

Thereafter, as shown in FIG. 4A, an etch-back process is performed by high-translation (anisotropy) RIE. As a result, the catalyst deactivation film 20 is etched back from the bottom surface in each via hole 40 and the upper surface outside the via hole 40. That is, the catalyst deactivation film 20 remains on only the side surface in the via hole 40, and is removed from the bottom surface in the via hole 40 and the upper surface outside the via hole 40. In other words, the catalyst underlying film 19 is exposed on the bottom surface in the via hole 40 and the upper surface outside the via hole 40.

Figure 4B:
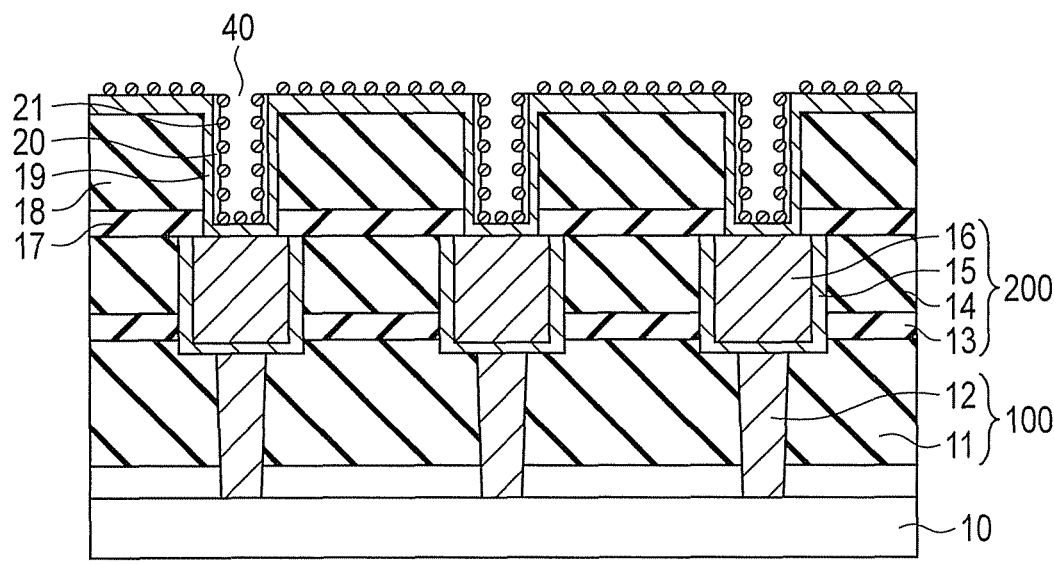

As shown in FIG. 4B, a catalyst film 21 is formed on the entire surface. That is, the catalyst film 21 is formed on the catalyst underlying film 19 on the bottom surface in each via hole 40 and the upper surface outside the via hole 40, and on the catalyst deactivation film 20 on the side surface in the via hole 40. The catalyst film 21 contains Co, Ni, or Fe. The catalyst film 21 is desirably formed discontinuously in a dispersion state to grow carbon nanotubes 22 at high density. To make the catalyst film 21 and catalyst deactivation film 20 react with each other, for example, annealing at 400° C. or higher is desirably performed. When the catalyst deactivation film 20 contains, for example, Si (for example, polysilicon or amorphous silicon), the catalyst film 21 is silicided on the side surface in the via hole 40, weakening the catalysis.

Figure 5A:
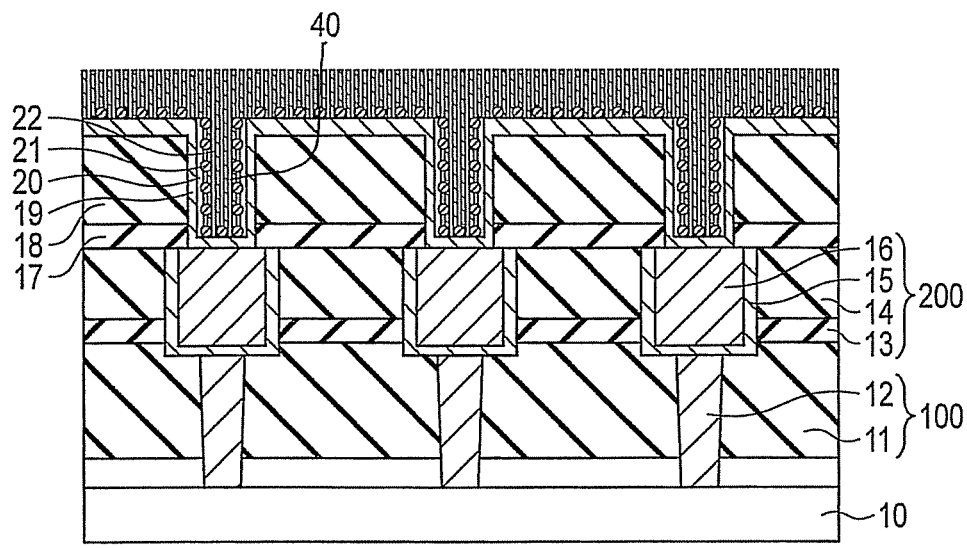

As shown in FIG. 5A, a plurality of carbon nanotubes 22 are formed as an electrically conductive layer in each via hole 40 by, for example, CVD. A hydrocarbon gas such as methane or acetylene, or a gaseous hydrocarbon mixture is used as the carbon source of CVD, and hydrogen and a rare gas are used as the carrier gas. Although the processing temperature has an upper limit of approximately 1,000° C. and a lower limit of approximately 200° C., the growth temperature is desirably approximately 350° C. It is also desirable to use remote plasma, and arrange an electrode above the substrate 10 and apply a voltage of approximately 0 to ±100 V in order to remove ions and electrons.

At this time, the catalyst deactivation film 20 is formed on the side surface in the via hole 40, as described above. For this reason, the carbon nanotubes 22 do not grow or grow very slowly from the side surface in the via hole 40. The carbon nanotubes 22 therefore grow from the catalyst film 21 on the bottom surface in the via hole 40 and the upper surface outside the via hole 40. That is, the carbon nanotube 22 in the via hole 40 is formed to extend (grow) vertically with one end being in contact with the bottom surface in the via hole 40.

Figure 5B:
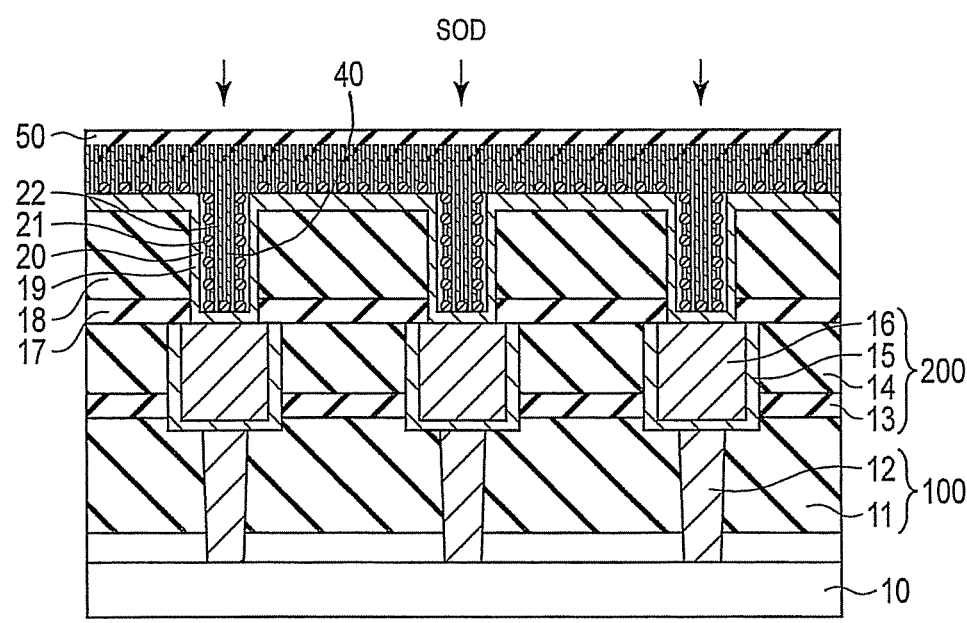

Then, as shown in FIG. 5B, an SOD film 50 is formed on the entire surface by spin coating. The SOD film 50 contains, for example, $SiO_2$. At this time, the intervals between the ends of the carbon nanotubes 22 on the upper surface outside the via hole 40 and those between ends of the carbon nanotubes 22 that project from the via hole 40 are impregnated with the SOD film 50, fixing the carbon nanotubes 22.

Figure 6:
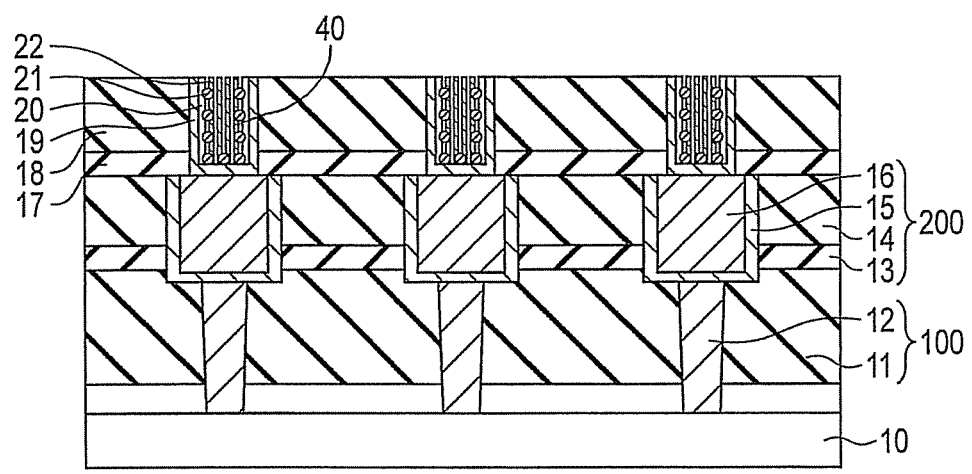

As shown in FIG. 6, the carbon nanotubes 22 on the upper surface outside the via hole 40 and the projections of the carbon nanotubes 22 from the via hole 40 that are impregnated with the SOD film 50 are polished and planarized by CMP.

After that, as shown in FIG. 1, a second interconnection layer 400 including a stopper film 23, an interconnection layer insulating film 24, barrier metal portions 25, and upper interconnections 26 is formed on the via layer 300. The second interconnection layer 400 is formed by the same process as that of the first interconnection layer 200. In this fashion, the carbon nanotube interconnection according to the first embodiment is formed.

Note that the first embodiment has described the manufacturing process of forming the carbon nanotubes 22 as the via 310 between the first interconnection layer 200 and the second interconnection layer 400. Alternatively, the carbon nanotubes 22 may be formed as the contact layer 100 between the substrate 10 and the first interconnection layer 200.

[Effects]

According to the first embodiment, the catalyst underlying film 19 is formed on the bottom and side surfaces in the via hole 40 (or contact hole) and on the upper surface outside the via hole 40. Then, the catalyst deactivation film 20 is formed on only the side surface in the via hole 40. With this structure, the carbon nanotubes 22 do not grow or grow very slowly from the side surface in the via hole 40. The via hole 40 is filled with a plurality of carbon nanotubes 22 which grow from the bottom surface directly contributing to electronic conduction. This can reduce the resistance of the via 310 and improve the electrical characteristics of the interconnection structure.

<Second Embodiment>

A carbon nanotube interconnection manufacturing method according to the second embodiment will be described with reference to FIGS. 7A, 7B, 8A, 8B, 9A, and 9B. The second embodiment will explain an example in which the growth rate of carbon nanotubes from the upper surface outside the via hole is decreased by forming a catalyst deactivation film not only on the side surface in the via hole but also on the upper surface outside the via hole. In the second embodiment, a description of the same parts as those in the first embodiment will not be repeated, and only a difference will be explained.

[Manufacturing Method]

FIGS. 7A, 7B, 8A, 8B, 9A, and 9B are sectional views respectively showing steps in manufacturing a carbon nanotube interconnection according to the second embodiment.

First, processes up to one shown in FIG. 3A in the first embodiment are performed. That is, a catalyst underlying film 19 is formed on the bottom and side surfaces in each via hole 40 in a via layer insulating film 18, and on the upper surface outside the via hole 40.

Figure 7A:
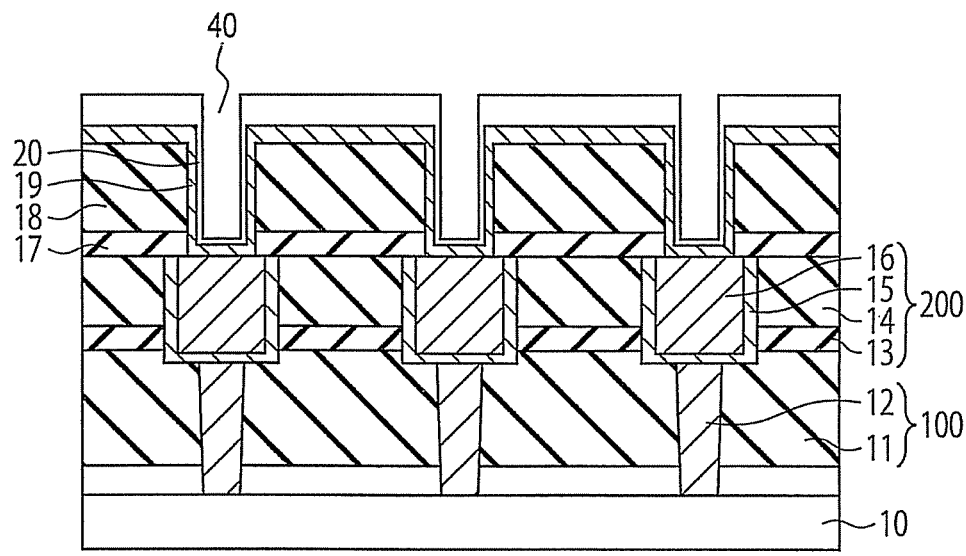
FIGS. 7A-9B are sectional views respectively showing steps in manufacturing a carbon nanotube interconnection according to the second embodiment.

Then, as shown in FIG. 7A, a catalyst deactivation film 20 is formed on the entire surface by, for example, CVD, PVD, or ALD. That is, the catalyst deactivation film 20 is formed on the bottom and side surfaces in each via hole 40, and on the catalyst underlying film 19 on the upper surface outside the via hole 40. The catalyst deactivation film 20 contains, for example, polysilicon, amorphous silicon, SiN, SiC, SiCN, Ru, or NiSi. At this time, the catalyst deactivation film 20 is formed by CVD, PVD, or ALD at high deposition rate so that the film thickness becomes larger on the upper surface outside the via hole 40 than on the bottom surface in the via hole 40.

Figure 7B:
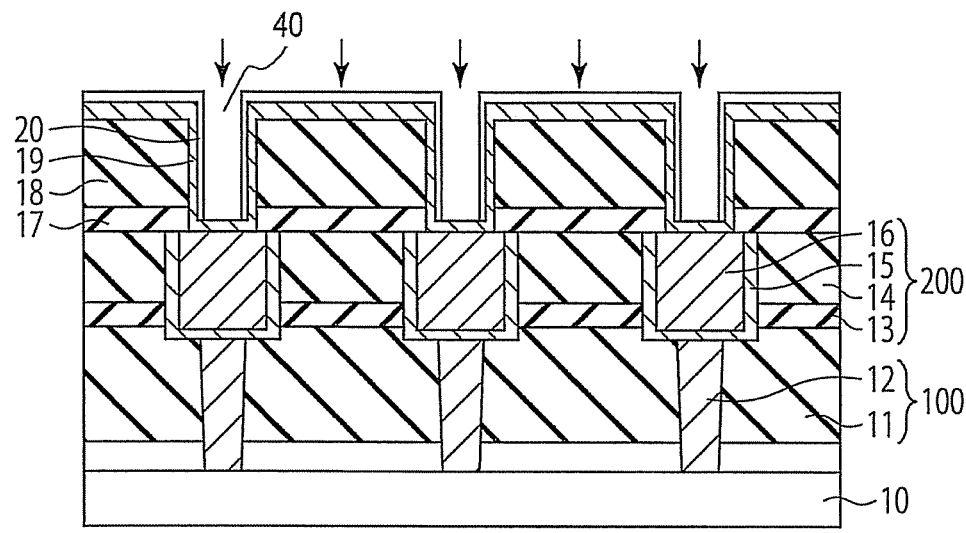

As shown in FIG. 7B, an etch-back process is performed by high-translation (anisotropy) RIE. By this process, the catalyst deactivation film 20 is etched back from the bottom surface in each via hole 40 and the upper surface outside the via hole 40. At this time, the catalyst deactivation film 20 remains on the upper surface outside the via hole 40 because the film thickness is large there. That is, the catalyst deactivation film 20 remains on the side surface in the via hole 40 and the upper surface outside the via hole 40, and is removed from the bottom surface in the via hole 40. In other words, the catalyst underlying film 19 is exposed on the bottom surface in the via hole 40.

Figure 8A:
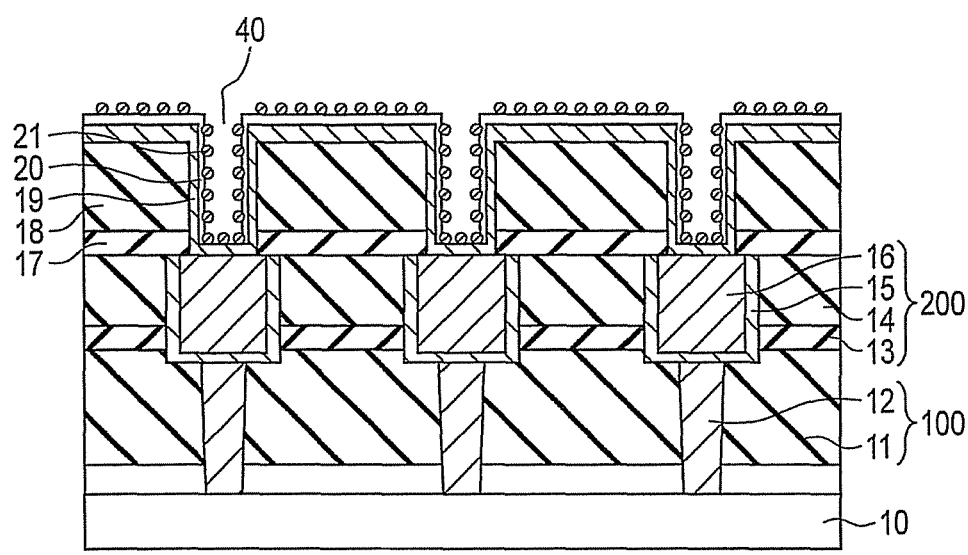

Thereafter, as shown in FIG. 8A, a catalyst film 21 is formed on the entire surface. That is, the catalyst film 21 is formed on the catalyst underlying film 19 on the bottom surface in each via hole 40, and on the catalyst deactivation film 20 on the side surface in the via hole 40 and the upper surface outside the via hole 40. The catalyst film 21 contains Co, Ni, or Fe. The catalyst film 21 is desirably formed discontinuously in a dispersion state to grow carbon nanotubes 22 at high density. To make the catalyst film 21 and catalyst deactivation film 20 react with each other, for example, annealing at 400° C. or higher is desirably performed. When the catalyst deactivation film 20 contains silicon, the catalyst film 21 is silicided on the side surface in the via hole 40 and the upper surface outside the via hole 40, weakening the catalysis.

Figure 8B:
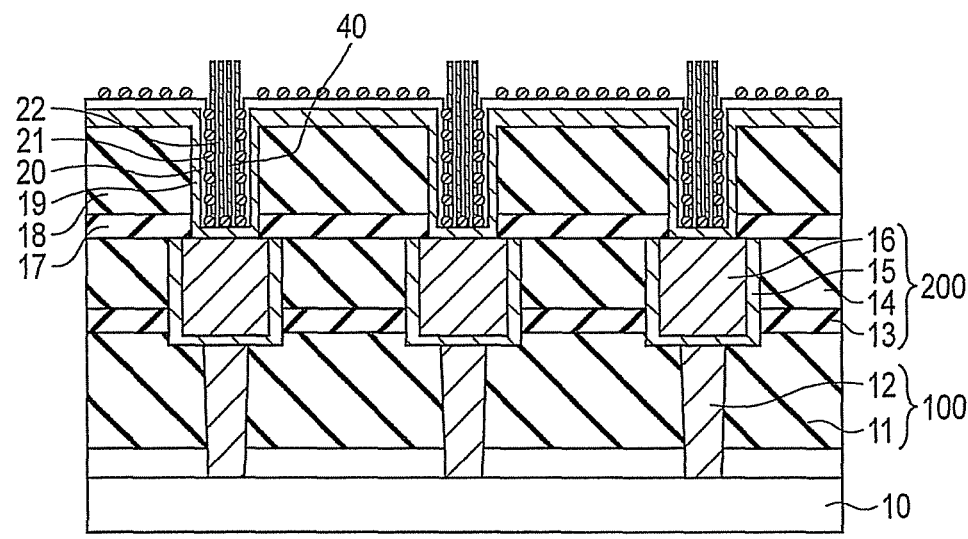

As shown in FIG. 8B, a plurality of carbon nanotubes 22 are formed as an electrically conductive layer in each via hole 40 by, for example, CVD. A hydrocarbon gas such as methane or acetylene, or a gaseous hydrocarbon mixture is used as the carbon source of CVD, and hydrogen and a rare gas are used as the carrier gas.

At this time, the catalyst deactivation film 20 is formed on the side surface in the via hole 40 and the upper surface outside the via hole, as described above. Thus, the carbon nanotubes 22 do not grow or grow very slowly from the side surface in the via hole 40 and the upper surface outside the via hole. The carbon nanotubes 22 grow from only the bottom surface in the via hole 40. That is, the density of the carbon nanotubes 22 is low on the upper surface outside the via hole.

Figure 9A:
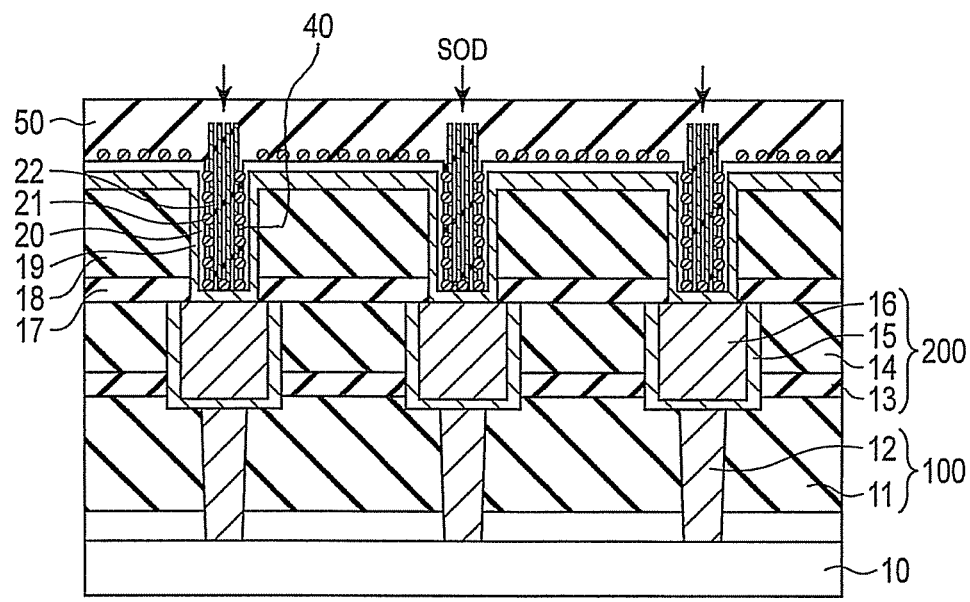

Then, as shown in FIG. 9A, an SOD film 50 is formed on the entire surface by spin coating. The SOD film 50 contains, for example, $SiO_2$. At this time, the SOD film 50 is formed on the upper surface outside the via hole 40 and fixes projections of the carbon nanotubes 22 from the via hole 40.

As shown in FIG. 6, the projections of the carbon nanotubes 22 from the via hole 40 that are fixed by the SOD film 50 are polished and planarized by CMP. After that, as shown in FIG. 1, a second interconnection layer 400 is formed on a via layer 300 by the same process as that of a first interconnection layer 200. The carbon nanotube interconnection according to the second embodiment is thus formed.

[Effects]

The second embodiment can obtain the same effects as those of the first embodiment.

Further in the second embodiment, the catalyst underlying film 19 is formed on the bottom and side surfaces in the via hole 40 (or contact hole) and on the upper surface outside the via hole 40. Then, the catalyst deactivation film 20 is formed on the side surface in the via hole 40 and the upper surface outside the via hole 40. With this structure, the carbon nanotubes 22 do not grow or grow very slowly from the side surface in the via hole 40 and also from the upper surface outside the via hole 40. Hence, the density of the carbon nanotubes 22 on the upper surface outside the via hole 40 becomes low. The SOD film 50 is easily formed on the upper surface outside the via hole 40 and fixes projections of carbon nanotubes 22 from the via hole 40. A CMP process can be carried out more easily for an excess part of the carbon nanotubes 22.

Since the growth of the carbon nanotubes 22 from the upper surface outside the via hole 40 can be suppressed, the amount of carbon nanotubes 22 to be removed can be decreased. Carbon nanotubes 22 are resistant to a chemical process in CMP. But in the second embodiment, the CMP process for an excess part of the carbon nanotubes 22 can be carried out easily by mainly using a mechanical polishing component.

Conversely, the carbon nanotubes 22 in the via hole 40 are formed at high density and thus fixed by the via layer insulating film 18. The growth rate or growth time of the carbon nanotubes 22 in the via hole 40 is controlled to shorten excess upper projections of the carbon nanotubes 22. The via layer insulating film 18 therefore fixes most of the carbon nanotubes 22. Also, CMP can be performed directly without fixing the carbon nanotubes 22 by the SOD film 50.

Figure 9B:
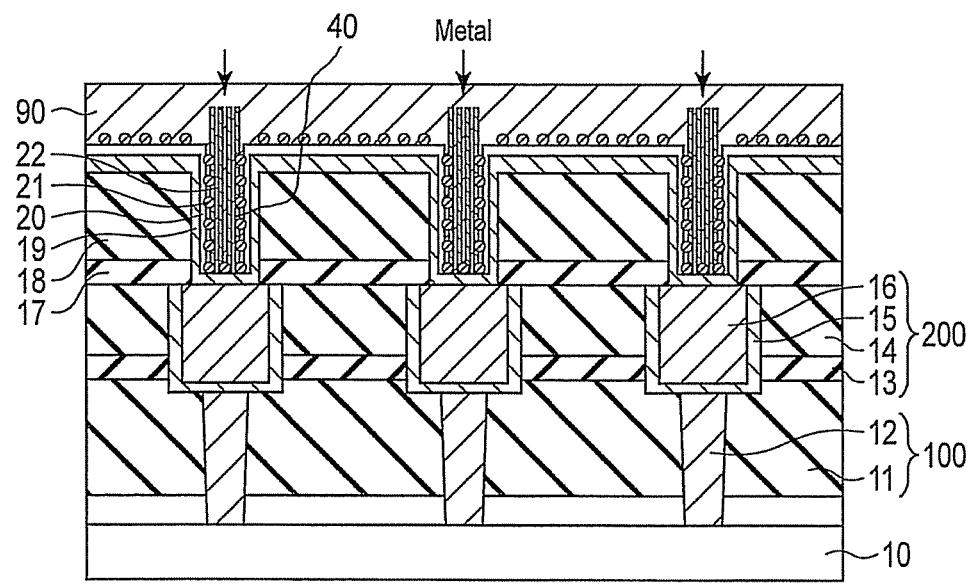

FIG. 9B shows a modification of the carbon nanotube interconnection manufacturing method according to the second embodiment.

As shown in FIG. 9B, after the carbon nanotubes 22 are formed in each via hole 40, a metal film 90 may be formed on the entire surface instead of the SOD film 50. In the second embodiment, the density of the carbon nanotubes 22 on the upper surface outside the via hole 40 is low. Even the metal film 90 with which the intervals between the carbon nanotubes 22 are hardly impregnated can fix projections of the carbon nanotubes 22 from the via hole 40. The metal film 90 contains, for example, W, Al, or Ti. The fixed carbon nanotubes 22 can be polished by easily controllable metal CMP.

<Third Embodiment>

A carbon nanotube interconnection manufacturing method according to the third embodiment will be described with reference to FIGS. 10, 11A, 11B, and 12. The third embodiment will explain an example in which carbon nanotubes and a metal portion are formed as a via. In the third embodiment, a description of the same parts as those in the above embodiments will not be repeated, and only a difference will be explained.

[Structure]

Figure 10:
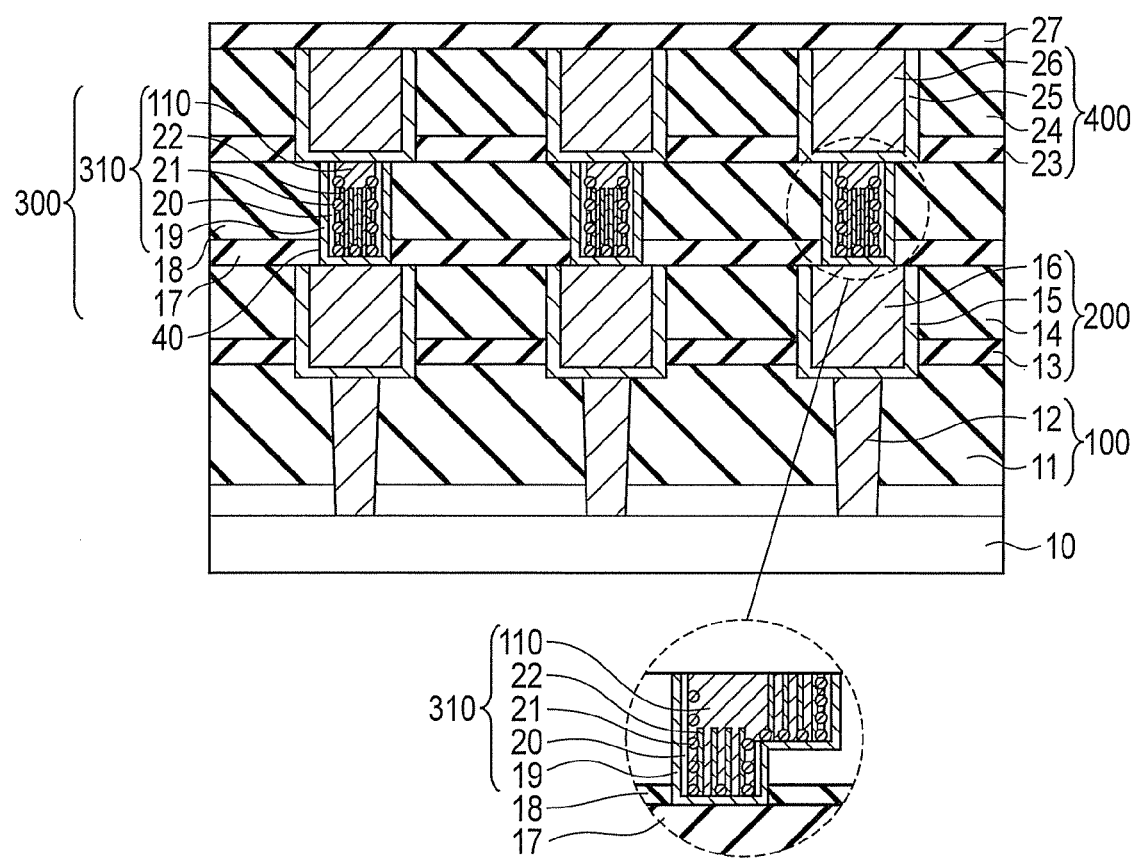
FIG. 10 is a sectional view showing the structure of a carbon nanotube interconnection according to the third embodiment.

FIG. 10 is a sectional view showing a carbon nanotube interconnection according to the third embodiment.

As shown in FIG. 10, the carbon nanotube interconnection structure according to the third embodiment is different from those in the above embodiments in that a via 310 comprises a catalyst underlying film 19, a catalyst deactivation film 20, a catalyst film 21, carbon nanotubes 22, and a metal portion 110.

The catalyst underlying film 19 is formed on the bottom surface in each via hole 40, and on a via layer insulating film 18 on the side surface. The catalyst deactivation film 20 is formed on the catalyst underlying film 19 on the side surface in the via hole 40. The catalyst film 21 is formed on the catalyst underlying film 19 in the via hole 40, and on the catalyst deactivation film 20.

A plurality of carbon nanotubes 22 are formed to extend (grow) vertically from the catalyst film 21 on the bottom surface in the via hole 40. The carbon nanotube 22 has one end in contact with the catalyst film 21 on the bottom surface in the via hole, and the other end formed midway in the via hole. When the via hole 40 is, for example, approximately 2 μm deep, the carbon nanotube 22 is formed to a height of approximately 1.5 μm on the lower side.

The metal portion 110 is formed on the carbon nanotubes 22 in the via hole 40 to fill the upper side of the via hole 40. The metal portion 110 is formed in contact with a second interconnection layer 400 at the top. That is, the metal portion 110 is formed between the carbon nanotubes 22 and the second interconnection layer 400 in the via hole 40. The metal portion 110 desirably contains a metal which easily produces a metal carbide by reaction with the carbon nanotubes 22. For example, the metal portion 110 contains Ti. Forming a metal carbide at the boundary between the metal portion 110 and the carbon nanotubes 22 allows formation of a good interface contact structure and reduction of the contact resistance.

[Manufacturing Method]

Figure 11A:
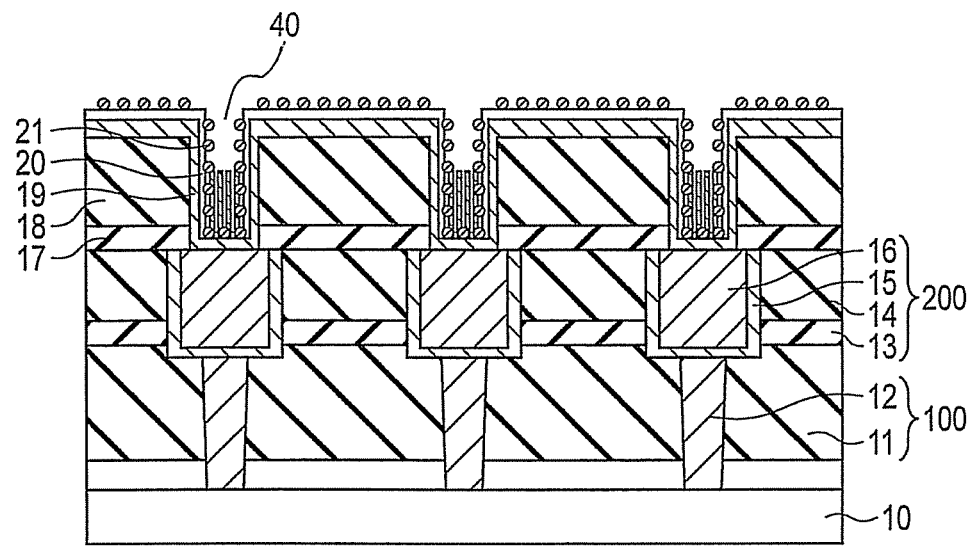
FIGS. 11A-12 are sectional views respectively showing steps in manufacturing the carbon nanotube interconnection according to the third embodiment.
Figure 11B:
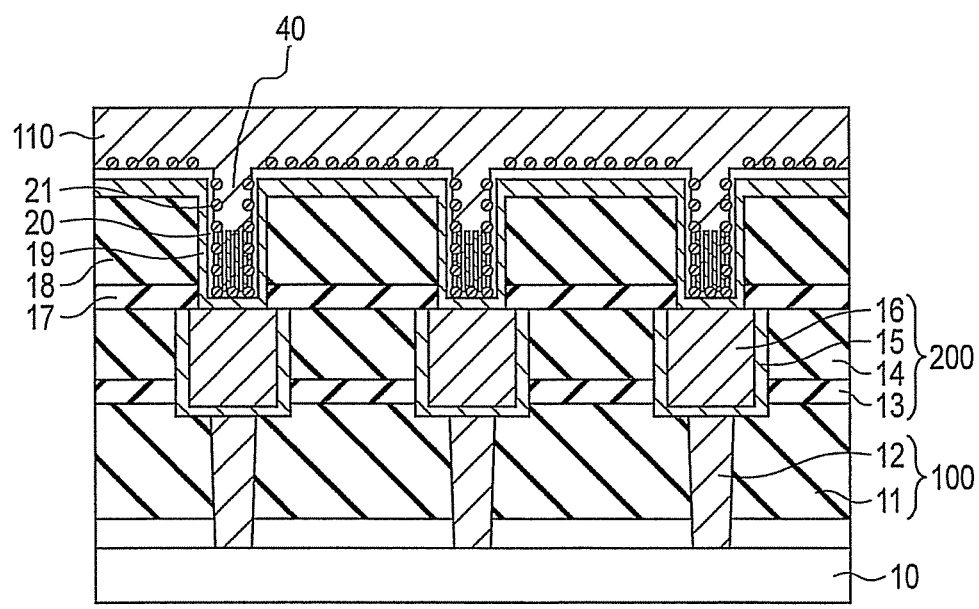
Figure 12:
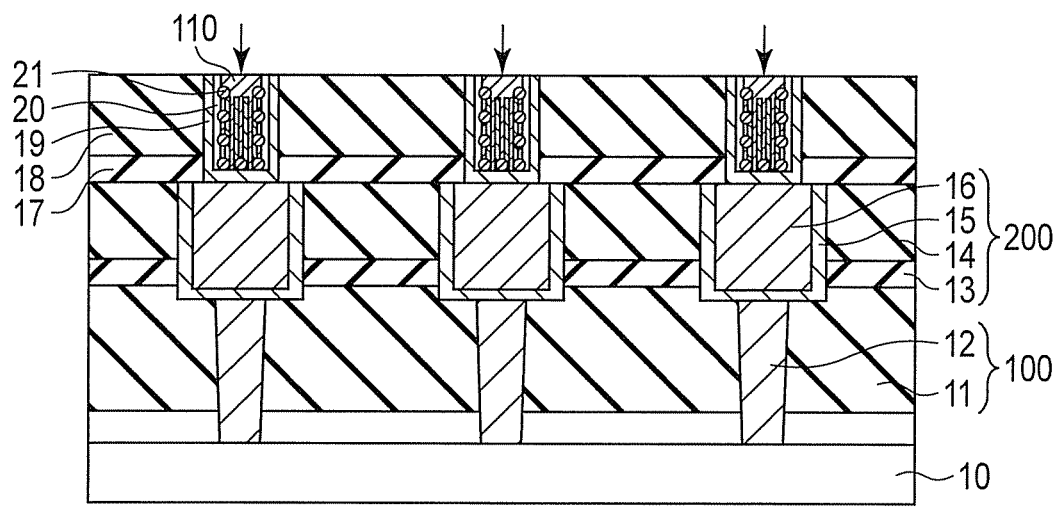

FIGS. 11A, 11B, and 12 are sectional views respectively showing steps in manufacturing the carbon nanotube interconnection according to the third embodiment.

First, processes up to one shown in FIG. 8A in the second embodiment are performed. That is, a catalyst film 21 is formed on the entire surface.

Then, as shown in FIG. 11A, a plurality of carbon nanotubes 22 are formed as an electrically conductive layer in each via hole 40 by, for example, CVD. A hydrocarbon gas such as methane or acetylene, or a gaseous hydrocarbon mixture is used as the carbon source of CVD, and hydrogen and a rare gas are used as the carrier gas. At this time, by controlling the growth rate and growth time of the carbon nanotubes 22, the carbon nanotubes 22 are formed midway on the lower side from the bottom surface in the via hole 40.

As shown in FIG. 11B, a metal portion 110 is formed on the entire surface. That is, the metal portion 110 fills the interior of each via hole 40 above the carbon nanotubes 22, and is also formed on the upper surface outside the via hole 40. Note that it is desirable to perform an ashing process using $O_2$ or CO, or a milling process using He or Ar for the distal ends (upper ends) of the carbon nanotubes 22 before forming the metal portion 110. Consequently, the distal ends of the carbon nanotubes 22 become open, and the multiwall of all the carbon nanotubes 22 can contribute to electrical conduction, further reducing the via resistance.

As shown in FIG. 12, an excess part of the metal portion 110 on the upper surface outside the via hole 40 and on the via hole 40 is polished and planarized by CMP. After that, as shown in FIG. 1, a second interconnection layer 400 is formed on a via layer 300 by the same process as that of a first interconnection layer 200. In this way, the carbon nanotube interconnection according to the third embodiment is formed.

[Effects]

The third embodiment can obtain the same effects as those of the first embodiment.

Further in the third embodiment, after the carbon nanotubes 22 are formed on the lower side in the via hole 40, the metal portion 110 is buried in the remaining upper side. In the via hole 40, the metal portion 110 can completely fill a gap in a region or the like where the growth rate of the carbon nanotubes 22 is low. Particularly when the via hole 40 has a stepped structure, as indicated by a broken line in FIG. 10, a gap is produced at the upper portion on the lower-level surface side even if growth rates of the carbon nanotubes 22 from lower- and upper-level surfaces are the same. In practice, such a stepped structure may be formed at the boundary between the stopper film 17 and the via layer insulating film 18. By forming the metal portion 110 in the thus-formed gap, the via hole 40 can be completely filled to improve the electrical characteristics.

<Fourth Embodiment>

A carbon nanotube interconnection manufacturing method according to the fourth embodiment will be described with reference to FIGS. 13A, 13B, 14A, 14B, and 15. The fourth embodiment will explain an example in which the catalyst film and catalyst underlying film are removed from the upper surface outside the via hole before forming carbon nanotubes. In the fourth embodiment, a description of the same parts as those in the above embodiments will not be repeated, and only a difference will be explained.

[Manufacturing Method]

FIGS. 13A, 13B, 14A, 14B, and 15 are sectional views respectively showing steps in manufacturing a carbon nanotube interconnection according to the fourth embodiment.

First, processes up to one shown in FIG. 4B in the first embodiment are performed. That is, a catalyst film 21 is formed on the entire surface. At this time, the catalyst film 21 is formed on a catalyst underlying film 19 on the bottom surface in each via hole 40 and the upper surface outside the via hole 40.

Figure 13A:
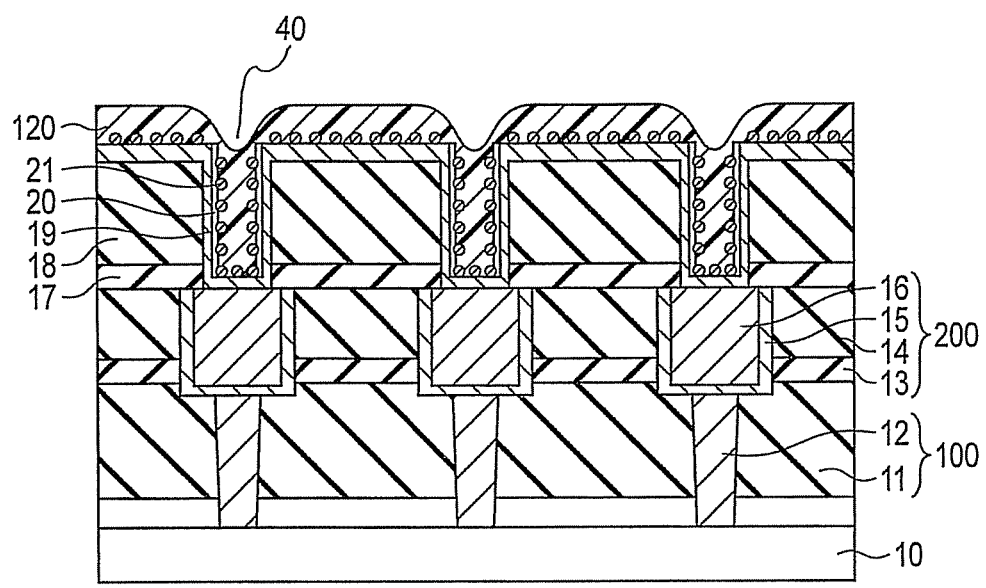
FIGS. 13A-15 are sectional views respectively showing steps in manufacturing a carbon nanotube interconnection according to the fourth embodiment.

Then, as shown in FIG. 13A, an organic film 120 is formed on the entire surface. The organic film 120 is a carbon film prepared by, for example, CVD, or an organic material (resist) prepared by coating. At this time, the organic film 120 is formed to cover at least the catalyst film 21 on the upper surface outside the via hole 40.

Figure 13B:
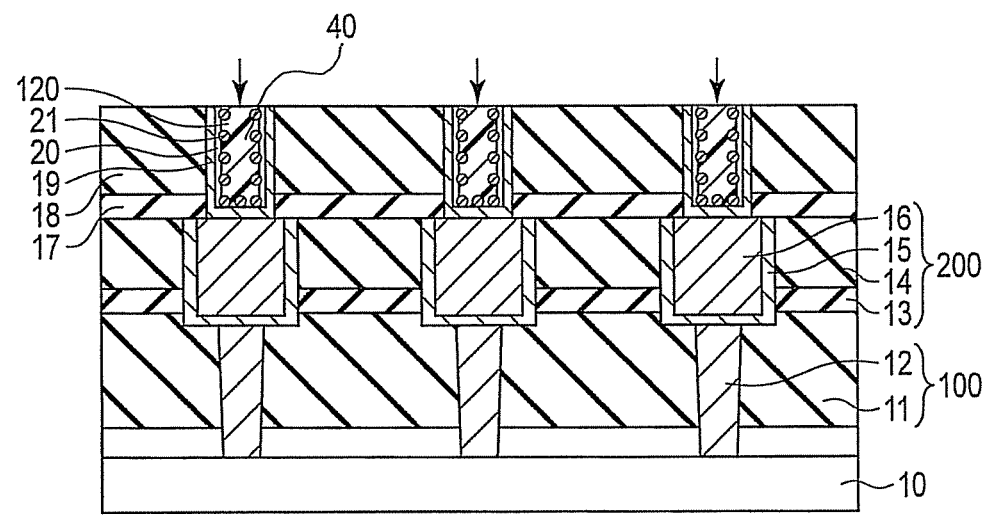

As shown in FIG. 13B, the organic film 120 on the upper surface outside the via hole 40 is polished and planarized by CMP, removing the catalyst film 21 and catalyst underlying film 19 from the upper surface outside the via hole 40. Since the via hole 40 is filled with the organic film 120, the slurry in CMP does not enter the via hole 40.

Figure 14A:
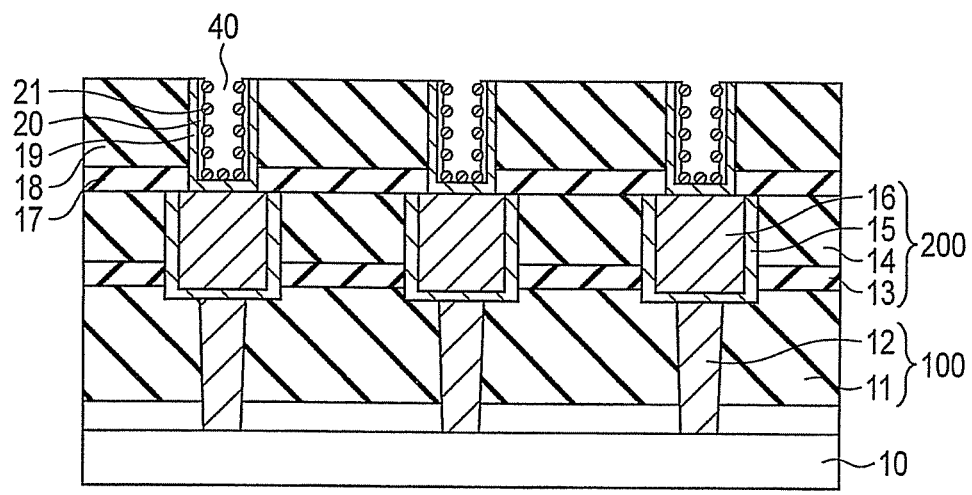

Thereafter, as shown in FIG. 14A, the organic film 120 in the via hole 40 is removed by an ashing process using $O_2$, Co, $H_2$, or $N_2$.

Figure 14B:
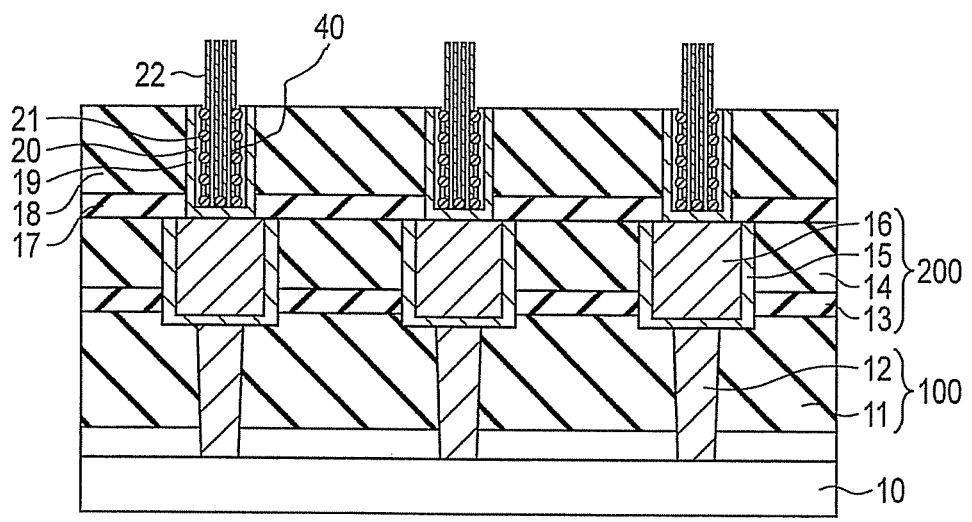

As shown in FIG. 14B, a plurality of carbon nanotubes 22 are formed as an electrically conductive layer in each via hole 40 by, for example, CVD. A hydrocarbon gas such as methane or acetylene, or a gaseous hydrocarbon mixture is used as the carbon source of CVD, and hydrogen and a rare gas are used as the carrier gas.

At this time, neither the catalyst film 21 nor catalyst underlying film 19 is formed on the upper surface outside the via hole. Thus, no carbon nanotube 22 grows from the upper surface outside the via hole. Since the catalyst deactivation film 20 is formed on the side surface in the via hole 40, the carbon nanotubes 22 do not grow or grow very slowly from the side surface in the via hole 40. The carbon nanotubes 22 grow from only the bottom surface in the via hole 40.

Figure 15:
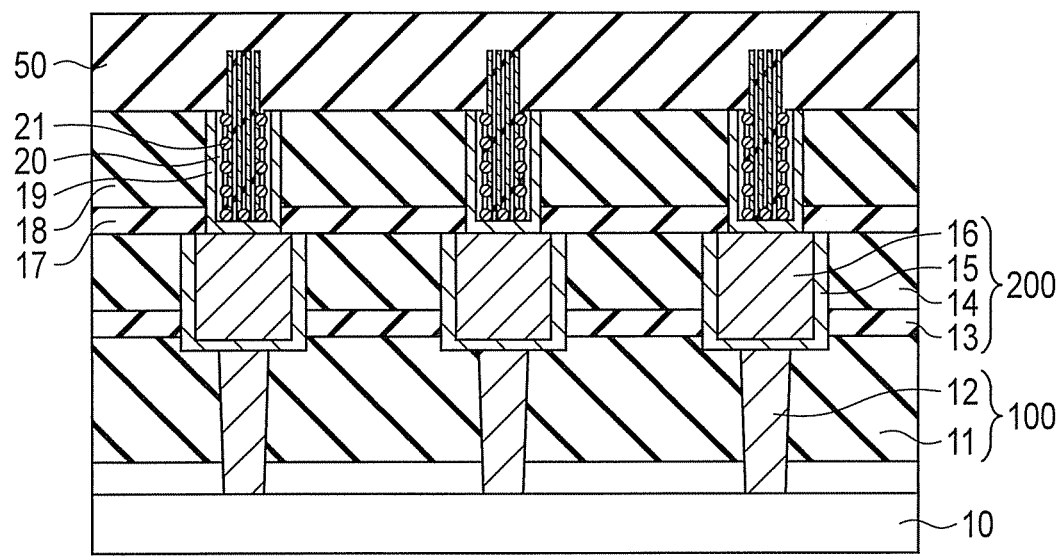

Then, as shown in FIG. 15, an SOD film 50 is formed on the entire surface by spin coating. The SOD film 50 contains, for example, $SiO_2$. At this time, the SOD film 50 is formed on the upper surface outside the via hole 40 and fixes projections of the carbon nanotubes 22 from the via hole 40.

As shown in FIG. 6, the projections of the carbon nanotubes 22 from the via hole 40 that are fixed by the SOD film 50 are polished and planarized by CMP. As shown in FIG. 1, a second interconnection layer 400 is formed on a via layer 300 by the same process as that of a first interconnection layer 200. As a result, the carbon nanotube interconnection according to the fourth embodiment is formed.

[Effects]

The fourth embodiment can obtain the same effects as those of the first embodiment.

Also in the fourth embodiment, the catalyst underlying film 19 and catalyst film 21 are removed from the upper surface outside the via hole 40 before forming the carbon nanotubes 22. This prevents the growth of the carbon nanotubes 22 from the upper surface outside the via hole 40. Thus, the SOD film 50 is easily formed on the upper surface outside the via hole 40 and fixes projections of the carbon nanotubes 22 from the via hole 40. A CMP process can be performed more easily for an excess part of the carbon nanotubes 22.

Since the growth of the carbon nanotubes 22 from the upper surface outside the via hole 40 can be suppressed, the amount of carbon nanotubes 22 to be removed can be decreased. Carbon nanotubes 22 are resistant to a chemical process in CMP. But in the fourth embodiment, the CMP process for an excess part of the carbon nanotubes 22 can be carried out easily by mainly using a mechanical polishing component.

In contrast, the carbon nanotubes 22 in the via hole 40 are formed at high density and thus fixed by the via layer insulating film 18. The growth rate or growth time of the carbon nanotubes 22 in the via hole 40 is controlled to shorten excess upper projections of the carbon nanotubes 22. Hence, the via layer insulating film 18 fixes most of the carbon nanotubes 22. CMP can be performed directly without fixing the carbon nanotubes 22 by the SOD film 50.

Similar to the second embodiment, a metal film 90 may be formed on the entire surface instead of the SOD film 50 after forming the carbon nanotubes 22 in each via hole 40, as shown in FIG. 9B. Similar to the third embodiment, a metal portion 110 may be buried in the remaining upper side after forming the carbon nanotubes 22 on the lower side in the via hole 40.

<Fifth Embodiment>

A carbon nanotube interconnection manufacturing method according to the fifth embodiment will be described with reference to FIGS. 16A, 16B, 17A, 17B, and 18. The fifth embodiment will explain an example in which the catalyst underlying film is removed from the upper surface outside the via hole before forming carbon nanotubes. In the fifth embodiment, a description of the same parts as those in the above embodiments will not be repeated, and only a difference will be explained.

[Manufacturing Method]

FIGS. 16A, 16B, 17A, 17B, and 18 are sectional views respectively showing steps in manufacturing a carbon nanotube interconnection according to the fifth embodiment.

First, processes up to one shown in FIG. 4A in the first embodiment are performed. That is, a catalyst deactivation film 20 is removed from the bottom surface in each via hole 40 and the upper surface outside the via hole 40.

Figure 16A:
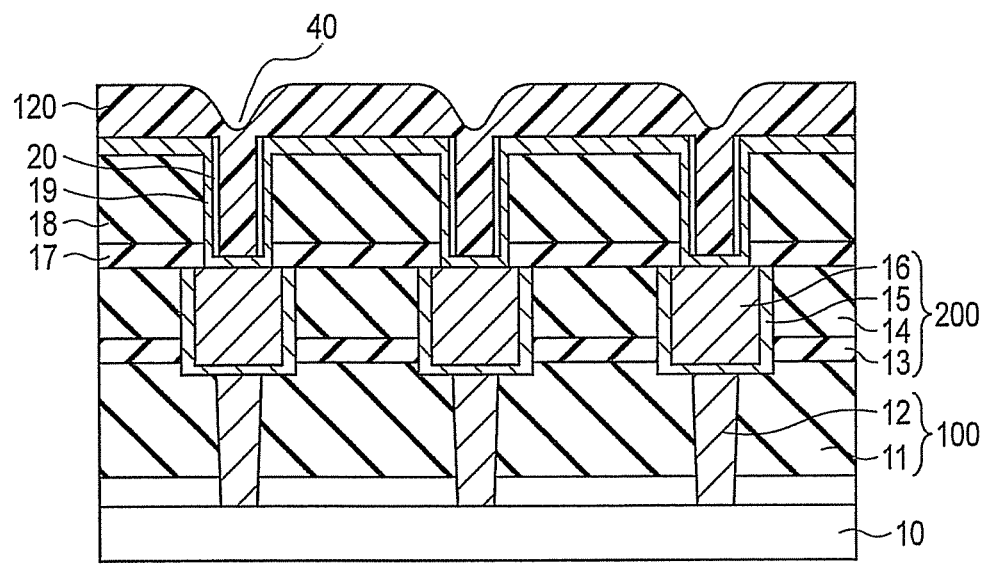
FIGS. 16A-18 are sectional views respectively showing steps in manufacturing a carbon nanotube interconnection according to the fifth embodiment.

Then, as shown in FIG. 16A, an organic film 120 is formed on the entire surface. The organic film 120 is a carbon film prepared by, for example, CVD, or an organic material (resist) prepared by coating. At this time, the organic film 120 is formed to cover at least a catalyst underlying film 19 on the upper surface outside the via hole 40.

Figure 16B:
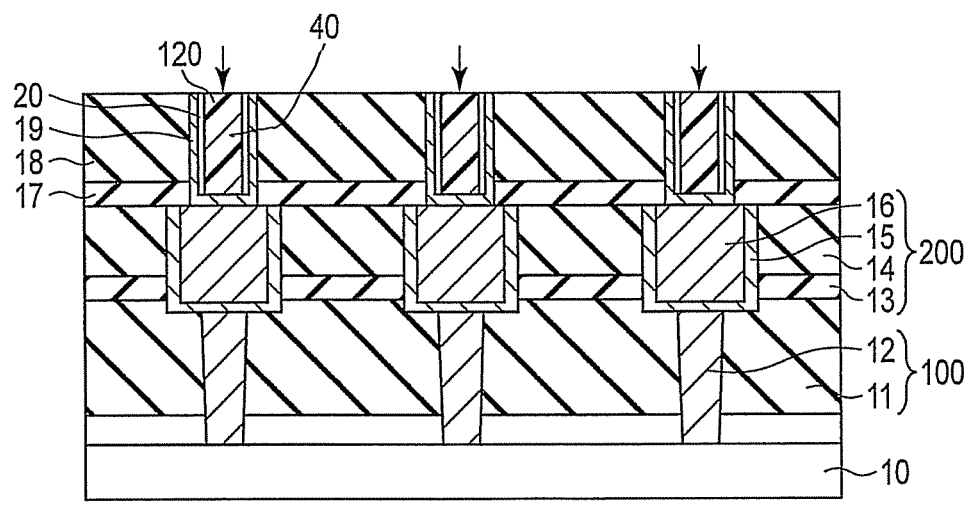

As shown in FIG. 16B, the organic film 120 on the upper surface outside the via hole 40 is polished and planarized by CMP, removing the catalyst underlying film 19 from the upper surface outside the via hole 40.

Figure 17A:
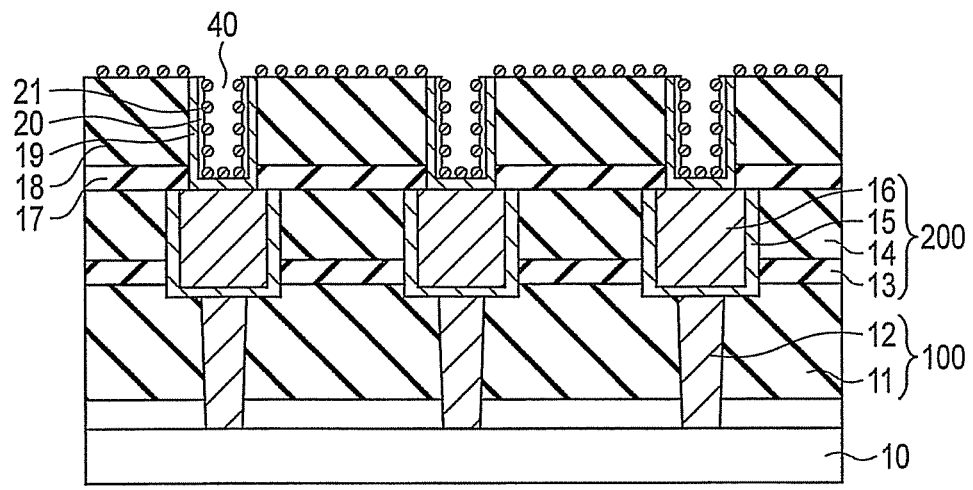

As shown in FIG. 17A, the organic film 120 in the via hole 40 is removed by an ashing process using $O_2$, Co, $H_2$, or $N_2$, and then a catalyst film 21 is formed on the entire surface. At this time, the catalyst film 21 is formed on the upper surface outside the via hole 40 without the mediacy of the catalyst underlying film 19.

Figure 17B:
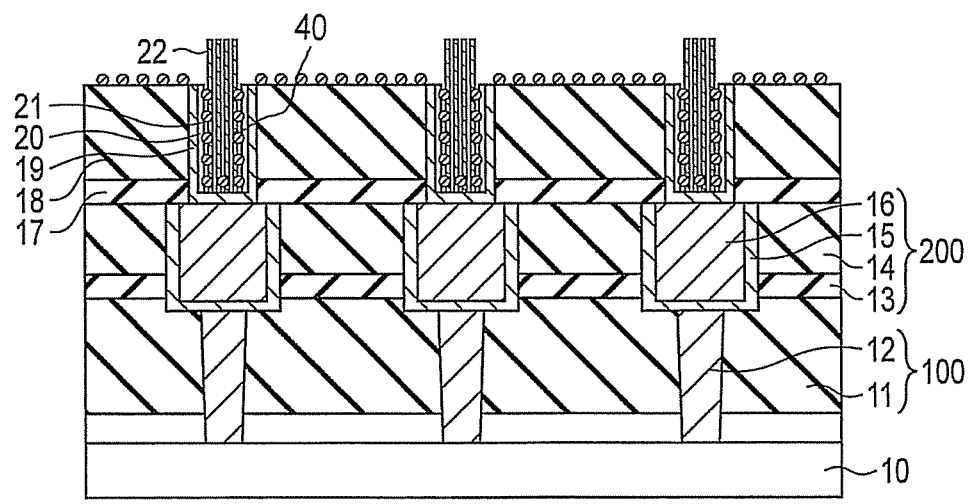

As shown in FIG. 17B, a plurality of carbon nanotubes 22 are formed as an electrically conductive layer in each via hole 40 by, for example, CVD. A hydrocarbon gas such as methane or acetylene, or a gaseous hydrocarbon mixture is used as the carbon source of CVD, and hydrogen and a rare gas are used as the carrier gas.

At this time, the catalyst underlying film 19 is not formed on the upper surface outside the via hole, as described above. For this reason, no carbon nanotube 22 grows from the upper surface outside the via hole. Since the catalyst deactivation film 20 is formed on the side surface in the via hole 40, the carbon nanotubes 22 do not grow or grow very slowly from the side surface in the via hole 40. The carbon nanotubes 22 grow from only the bottom surface in the via hole 40.

Figure 18:
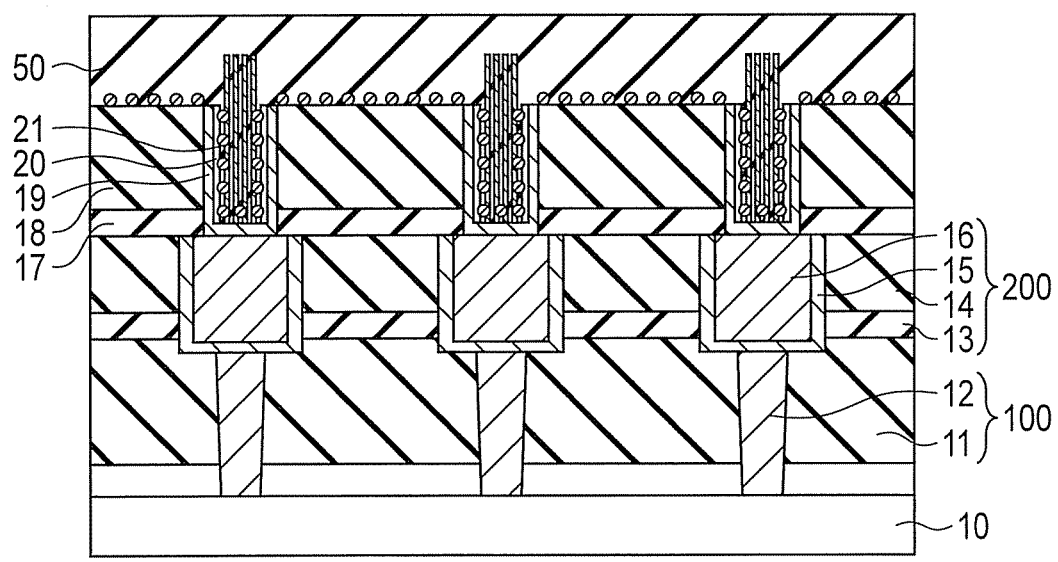

Then, as shown in FIG. 18, an SOD film 50 is formed on the entire surface by spin coating. The SOD film 50 contains, for example, $SiO_2$. At this time, the SOD film 50 is formed on the upper surface outside the via hole 40 and fixes projections of the carbon nanotubes 22 from the via hole 40.

As shown in FIG. 6, the excess part of the carbon nanotubes 22 above the via hole 40 that is fixed by the SOD film 50 is polished and planarized by CMP. At this time, even the catalyst film 21 is removed from the upper surface outside the via hole 40. Thereafter, as shown in FIG. 1, a second interconnection layer 400 is formed on a via layer 300 by the same process as that of a first interconnection layer 200. In this manner, the carbon nanotube interconnection according to the fifth embodiment is formed.

[Effects]

The fifth embodiment can obtain the same effects as those of the first embodiment.

Also in the fifth embodiment, the catalyst underlying film 19 is removed from the upper surface outside the via hole 40 before forming the carbon nanotubes 22. The fifth embodiment can achieve the same effects as those of the fourth embodiment.

<Sixth Embodiment>

A carbon nanotube interconnection manufacturing method according to the sixth embodiment will be described with reference to FIGS. 19A, 19B, 20, 21A, 21B, 22A, and 22B. The sixth embodiment will explain an example in which the catalyst film is removed from the upper surface outside the via hole before forming carbon nanotubes. In the sixth embodiment, a description of the same parts as those in the above embodiments will not be repeated, and only a difference will be explained.

[Manufacturing Method]

Figure 19A:
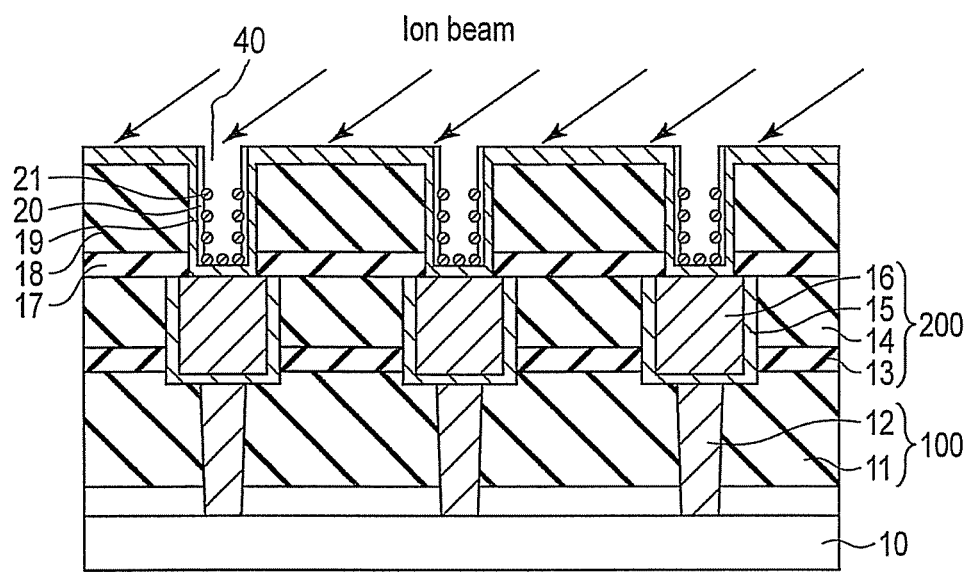
FIGS. 19A-22B are sectional views respectively showing steps in manufacturing a carbon nanotube interconnection according to the sixth embodiment.
Figure 19B:
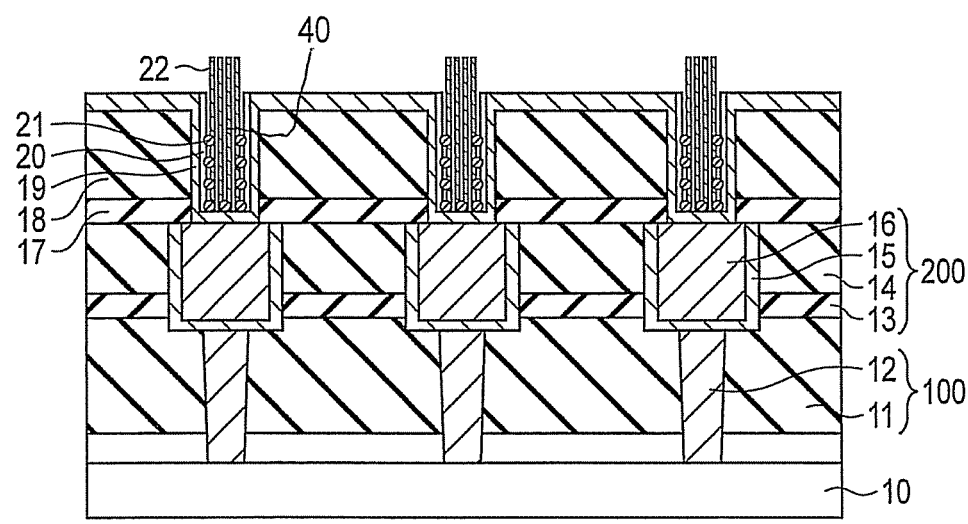
Figure 20:
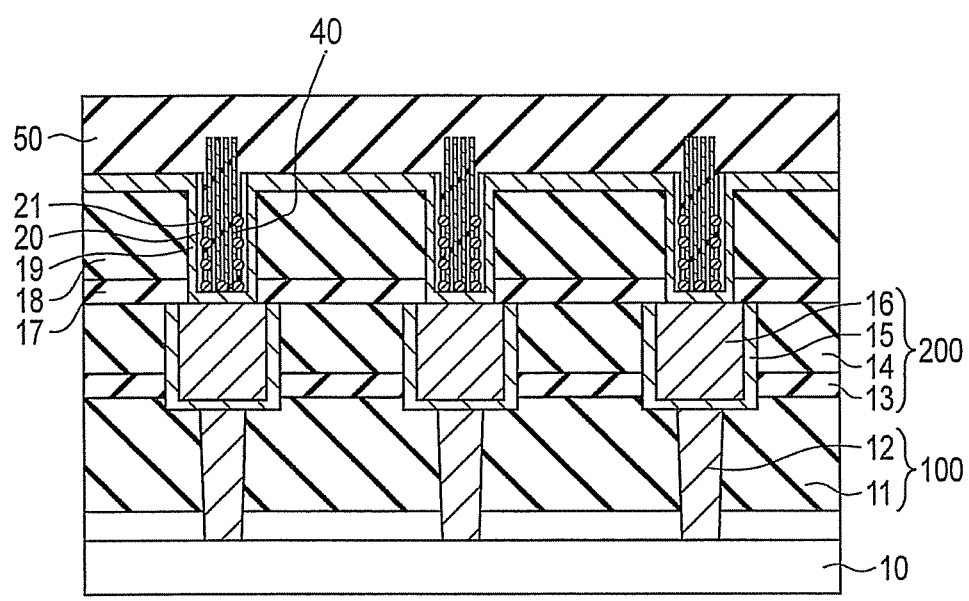

FIGS. 19A, 19B, and 20 are sectional views respectively showing steps in manufacturing a carbon nanotube interconnection according to the sixth embodiment.

First, processes up to one shown in FIG. 4B in the first embodiment are performed. That is, a catalyst film 21 is formed on the entire surface. At this time, the catalyst film 21 is formed on a catalyst underlying film 19 on the bottom surface in each via hole 40 and the upper surface outside the via hole 40.

Then, as shown in FIG. 19A, the upper surface outside the via hole 40 is irradiated with an ion beam at an oblique angle (obliquely with respect to the incident surface). More specifically, the ion beam is emitted at an oblique angle enough not to reach the bottom surface in the via hole 40. As the ion beam, for example, an argon plasma beam is emitted. The ion beam removes the catalyst film 21 from the upper surface outside the via hole 40. Since the ion beam enters at an oblique angle, it removes even the catalyst film 21 on the side surface near the opening (upper part) of the via hole 40.

As shown in FIG. 19B, a plurality of carbon nanotubes 22 are formed as an electrically conductive layer in each via hole 40 by, for example, CVD.

At this time, the catalyst film 21 is not formed on the upper surface outside the via hole, as described above. Thus, no carbon nanotube 22 grows from the upper surface outside the via hole. Since the catalyst deactivation film 20 is formed on the side surface in the via hole 40, the carbon nanotubes 22 do not grow or grow very slowly from the side surface in the via hole 40. The carbon nanotubes 22 grow from only the bottom surface in the via hole 40.

As shown in FIG. 20, an SOD film 50 is formed on the entire surface by spin coating. The SOD film 50 contains, for example, $SiO_2$. At this time, the SOD film 50 is formed on the upper surface outside the via hole 40 and fixes projections of the carbon nanotubes 22 from the via hole 40.

As shown in FIG. 6, the excess part of the carbon nanotubes 22 above the via hole 40 that is fixed by the SOD film 50 is polished and planarized by CMP. Then, as shown in FIG. 1, a second interconnection layer 400 is formed on a via layer 300 by the same process as that of a first interconnection layer 200. In this fashion, the carbon nanotube interconnection according to the sixth embodiment is formed.

[Effects]

The sixth embodiment can obtain the same effects as those of the first embodiment.

Further in the sixth embodiment, the upper surface outside the via hole 40 is irradiated with an ion beam at an oblique angle before forming the carbon nanotubes 22. The ion beam removes the catalyst film 21 from the upper surface outside the via hole 40. The sixth embodiment can achieve the same effects as those of the fourth embodiment.

Figure 21A:
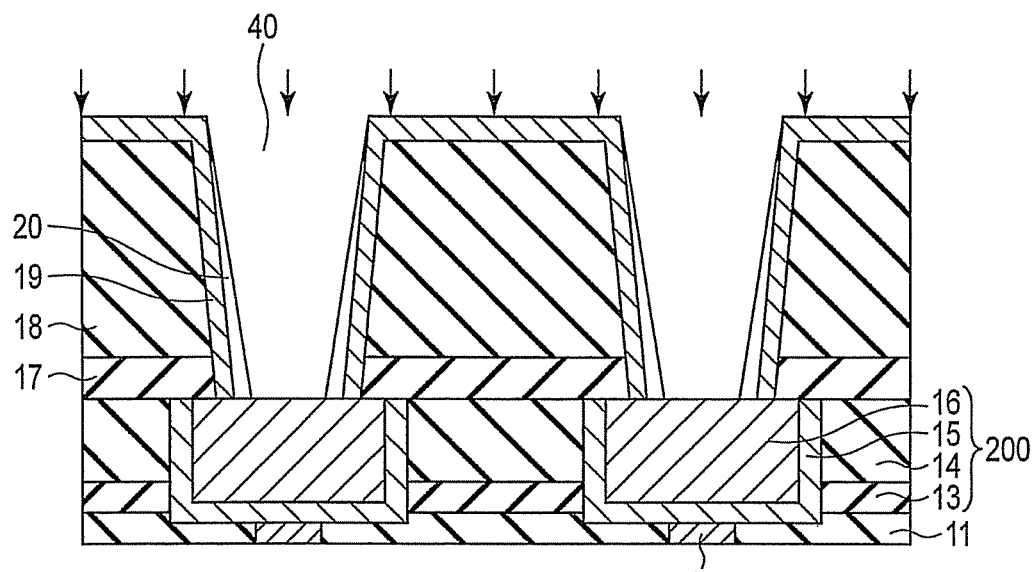

In some cases, the via hole 40 may have a tapered shape, as shown in FIG. 21A. When the taper angle of the via hole 40 is 85° or less, even the catalyst deactivation film 20 is removed from the side surface near the opening of the via hole 40 when performing an etch-back process after forming the catalyst deactivation film 20.

Figure 21B:
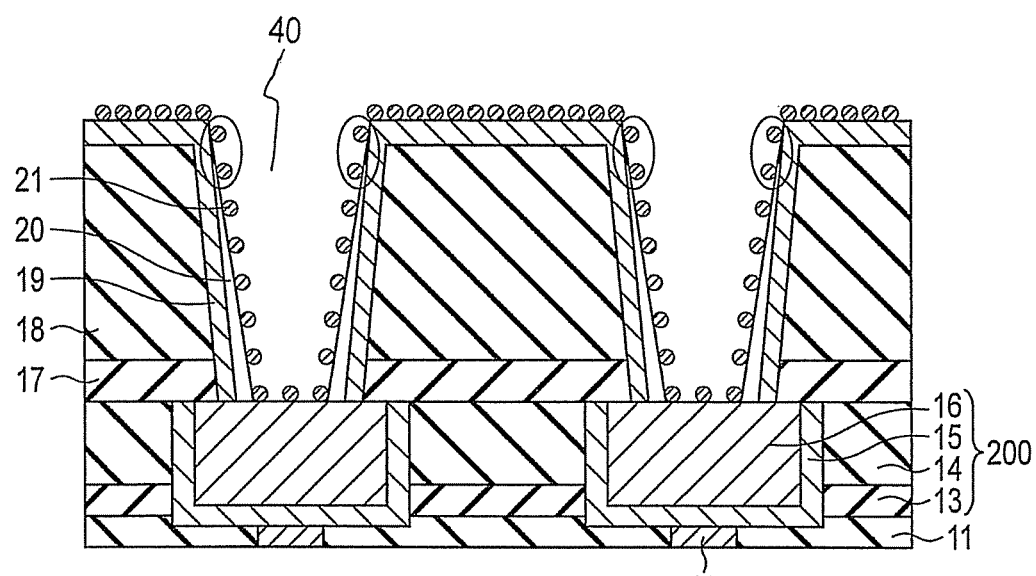

As shown in FIG. 21B, the catalyst film 21 is then formed on the entire surface. At this time, the catalyst film 21 is formed on the catalyst underlying film 19 on the side surface near the opening of the via hole 40 without the mediacy of the catalyst deactivation film 20, and is activated as a catalyst. Consequently, the carbon nanotubes 22 are formed from the side surface in the via hole 40.

Figure 22A:
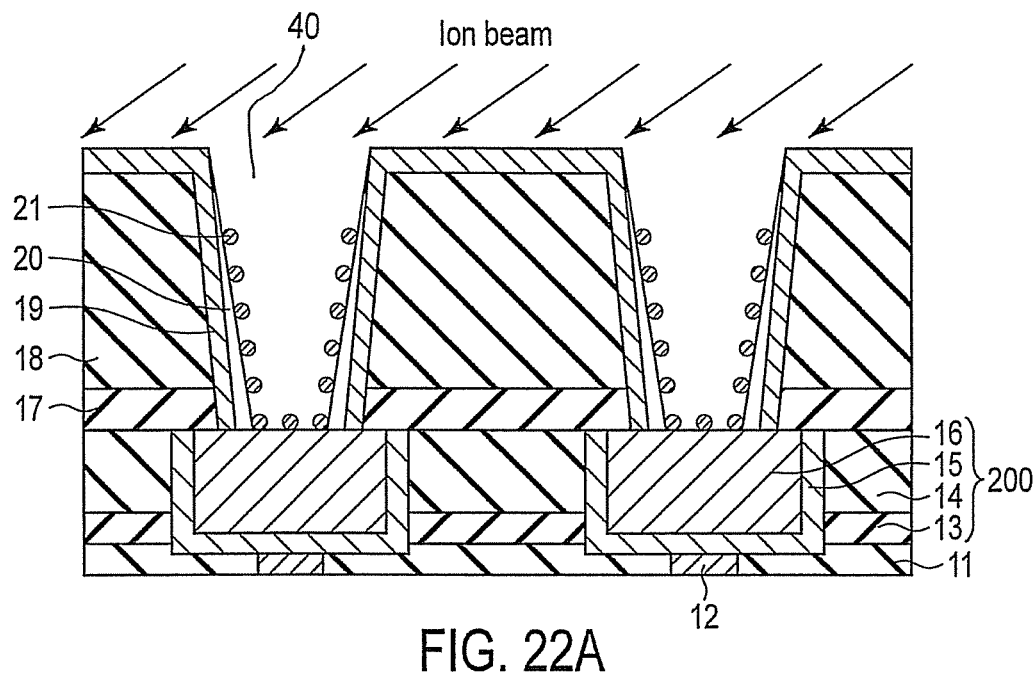
Figure 22B:
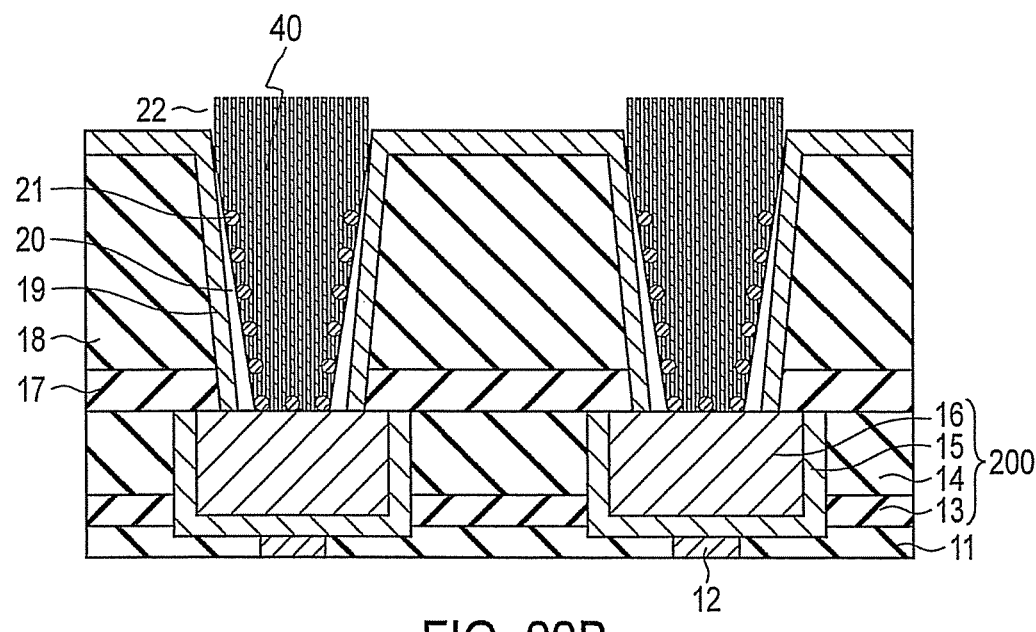

To prevent this, in the sixth embodiment, the catalyst film 21 can be removed from the side surface near the opening (upper part) of the via hole 40 by emitting an ion beam at an oblique angle, as shown in FIG. 22A. That is, even when the catalyst deactivation film 20 is removed by etch-back from the side surface near the opening of the via hole 40, the catalyst film 21 formed in this region can be removed. The growth of the carbon nanotubes 22 from the side surface in the via hole 40 can be suppressed as shown in FIG. 22B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A carbon nanotube interconnection comprising:
    a first conductive layer;
    an insulating film formed on the first conductive layer and including a hole extending from an upper surface to a lower surface;
    a catalyst underlying film formed on the first conductive layer on a bottom surface in the hole and on the insulating film on a side surface in the hole;

a catalyst deactivation film formed on the catalyst underlying film on the side surface in the hole;
a catalyst film formed on the catalyst underlying film on the bottom surface in the hole and the catalyst deactivation film on the side surface in the hole; and
carbon nanotubes formed in the hole, the carbon nanotubes including one end in contact with the catalyst film on the bottom surface in the hole.

2. The interconnection of claim 1, further comprising a second conductive layer formed on the insulating film,
wherein the carbon nanotubes include the other end in contact with the second conductive layer.

3. The interconnection of claim 1, further comprising:
a second conductive layer formed on the insulating film; and
a metal film formed between the carbon nanotubes and the second conductive layer in the hole,
wherein the carbon nanotubes include the other end in contact with the metal film.

4. The interconnection of claim 3, wherein
the metal film contains Ti, and
the other end of the carbon nanotubes contains Ti carbide.

5. The interconnection of claim 3, wherein the other end of the carbon nanotubes is open.

6. The interconnection of claim 1, wherein
the catalyst underlying film contains one of Ta, Ti, TaN, and TiN,
the catalyst film contains one of Co, Ni, and Fe, and
the catalyst deactivation film contains one of Si, SIN, SIC, SiCN, Ru, and NiSi.

7. The interconnection of claim 1, wherein
the catalyst underlying film contains one of Ti and TiN, and
one end of the carbon nanotubes contains Ti carbide.

8. The interconnection of claim 1, wherein
the catalyst deactivation film contains one of polysilicon and amorphous silicon, and
the catalyst film is silicided.

9. The interconnection of claim 1, wherein
the hole has a tapered shape whose diameter increases from a lower side to an upper side, and
the catalyst film is not formed on a side surface on the upper side in the hole.

10. A carbon nanotube interconnection manufacturing method comprising:
forming an insulating film on a first conductive layer;
forming a hole in the insulating film to extend through the insulating film;
forming a catalyst underlying film on the first conducive layer on a bottom surface in the hole and on the insulating film on a side surface in the hole;
forming a catalyst deactivation film on the catalyst underlying film on the side surface in the hole;
forming a catalyst film on the catalyst underlying film on the bottom surface in the hole and on the catalyst deactivation film on the side surface in the hole; and
growing carbon nanotubes from the catalyst film on the bottom surface in the hole.

11. The method of claim 10, wherein after forming the catalyst film, the catalyst deactivation film and the catalyst film on the side surface in the hole are annealed.

12. The method of claim 10, wherein when forming the catalyst deactivation film, the catalyst deactivation film is formed even on an upper surface outside the hole.

13. The method of claim 12, wherein
when growing the carbon nanotubes, the carbon nanotubes are formed to project from the hole,
after growing the carbon nanotubes, a metal film is formed on an entire surface to fix projections of the carbon nanotubes, and
the metal film and the projections of the carbon nanotubes are polished by metal CMP.

14. The method of claim 12, wherein
when growing the carbon nanotubes, the carbon nanotubes are formed not to project from the hole, and
after growing the carbon nanotubes, a metal film is formed on the carbon nanotubes to fill the hole.

15. The method of claim 10, wherein
when forming the catalyst film, the catalyst film is formed on even an upper surface outside the hole, and
after forming the catalyst film, the catalyst film is removed from the upper surface outside the hole.

16. The method of claim 15, wherein the catalyst film is removed from the upper surface outside the hole by irradiating the upper surface outside the hole with an ion beam at an oblique angle.

17. The method of claim 10, wherein
when forming the catalyst underlying film, the catalyst underlying film is formed on even an upper surface outside the hole, and
after forming the catalyst underlying film, the catalyst underlying film is removed from the upper surface outside the hole.

18. The method of claim 17, wherein the catalyst underlying film is removed from the upper surface outside the hole by forming an organic film to cover the catalyst underlying film on the upper surface outside the hole, and polishing the organic film and the catalyst underlying film on the upper surface outside the hole by CMP.

* * * * *